United States Patent
Magness et al.

(10) Patent No.: US 11,752,571 B1
(45) Date of Patent: Sep. 12, 2023

(54) COHERENT BEAM COUPLER

(71) Applicant: LEONARDO ELECTRONICS US INC., Tucson, AZ (US)

(72) Inventors: Connor Magness, Tucson, AZ (US); Prabhuram Thiagarajan, Tucson, AZ (US); Jason Helmrich, Tucson, AZ (US)

(73) Assignee: LEONARDO ELECTRONICS US INC., Tucson, AZ (US)

( * ) Notice: Subject to any disclaimer, the term of this patent is extended or adjusted under 35 U.S.C. 154(b) by 33 days.

(21) Appl. No.: 16/895,961

(22) Filed: Jun. 8, 2020

Related U.S. Application Data

(60) Provisional application No. 62/858,743, filed on Jun. 7, 2019.

(51) Int. Cl.
*B23K 26/06* (2014.01)
*H01S 5/40* (2006.01)
(Continued)

(52) U.S. Cl.
CPC ...... *B23K 26/0604* (2013.01); *B23K 26/0643* (2013.01); *B23K 26/0648* (2013.01);
(Continued)

(58) Field of Classification Search
CPC ............ B23K 26/0604; B23K 26/0643; B23K 26/0648; B23K 26/073; B23K 26/0738; H01S 5/00; H01S 2301/00; H01S 2304/00
(Continued)

(56) References Cited

U.S. PATENT DOCUMENTS

| | | | |
|---|---|---|---|
| 3,711,939 A | 1/1973 | Stoll | 228/246 |
| 3,805,375 A | 4/1974 | LaCombe et al. | 29/832 |

(Continued)

FOREIGN PATENT DOCUMENTS

| | | |
|---|---|---|
| CA | 2 208 370 C | 7/2005 |
| DE | 968430 | 2/1958 |

(Continued)

OTHER PUBLICATIONS

Watson, Edward, Walter Whitaker, Christopher Brewer, and Scott Harris; "Implementing Optical Phased Array Beam Steering with Cascaded Microlens Arrays;" IEEE Proceedings, IEEE Aerospace Conference; Mar. 9-16, 2002 (Year: 2002).*

(Continued)

*Primary Examiner* — Tu B Hoang
*Assistant Examiner* — Erwin J Wunderlich
(74) *Attorney, Agent, or Firm* — HAYES SOLOWAY P.C.

(57) ABSTRACT

A coherent beam coupled laser diode array includes an array of laser diodes. Each diode emits a beam propagating along a beam path. An array of collimation optics is included. Each of the collimation optics collimates one beam. A first lenslet array is included. Each lenslet refracts a portion of one beam and a portion of a different beam from the array. A partially reflecting mirror is included. A first portion of each beam propagates through the partially reflecting mirror and a second portion of each beam is reflected back toward the first lenslet array. The second portion of each beam reflected propagates back through the first lenslet array and the collimation optics and into one of the diodes in the array of laser diodes, thereby creating an optical cross coupling. A second lenslet array collimates each beam propagating through each lenslet to form a single laser beam.

20 Claims, 13 Drawing Sheets

(51) Int. Cl.
*G02B 6/28* (2006.01)
*H01S 5/00* (2006.01)

(52) U.S. Cl.
CPC ............ *G02B 6/2813* (2013.01); *H01S 5/005* (2013.01); *H01S 5/4062* (2013.01)

(58) Field of Classification Search
USPC .................................................. 219/121.76
See application file for complete search history.

(56) References Cited

U.S. PATENT DOCUMENTS

| | | | |
|---|---|---|---|
| 3,936,322 A | 2/1976 | Blum et al. ...................... 148/1.5 |
| 4,092,614 A | 5/1978 | Sakuma et al. | |
| 4,156,879 A | 5/1979 | Lee ................... 357/22 |
| 4,306,278 A | 12/1981 | Fulton et al. ................. 362/259 |
| 4,653,056 A | 3/1987 | Baer et al. | |
| 4,767,674 A | 8/1988 | Shirai .................... 257/E23.006 |
| 4,803,691 A | 2/1989 | Scifres et al. ................. 372/150 |
| 4,813,762 A * | 3/1989 | Leger .................... H01S 5/4062 372/18 |
| 4,881,237 A | 11/1989 | Donnelly | |
| 4,903,274 A | 2/1990 | Taney et al. | |
| 4,947,401 A | 8/1990 | Hinata et al. | |
| 4,980,893 A | 12/1990 | Thornton et al. | |
| 4,993,148 A | 2/1991 | Adachi ......... 174/252 |
| 5,008,737 A | 4/1991 | Burnham et al. .............. 357/81 |
| 5,027,359 A * | 6/1991 | Leger ..................... H01S 3/005 372/18 |
| 5,031,187 A | 7/1991 | Orenstein et al. | |
| 5,033,060 A * | 7/1991 | Leger ..................... G02B 6/425 372/18 |
| 5,040,187 A | 8/1991 | Karpinski | |
| 5,045,972 A | 9/1991 | Supan | |
| 5,060,237 A | 10/1991 | Peterson | |
| 5,061,974 A | 10/1991 | Onodera et al. | |
| 5,099,488 A | 3/1992 | Ahrabi et al. | |
| 5,102,825 A | 4/1992 | Brennan et al. .............. 437/129 |
| 5,105,429 A | 4/1992 | Mundinger et al. | |
| 5,105,430 A | 4/1992 | Mundinger et al. | |
| 5,128,951 A | 7/1992 | Karpinski | |
| 5,139,609 A * | 8/1992 | Fields ................. H01S 3/09415 372/50.23 |
| 5,202,706 A | 4/1993 | Hasegawa ..................... 359/819 |
| 5,212,706 A | 5/1993 | Jain | |
| 5,212,707 A | 5/1993 | Heidel et al. | |
| 5,253,260 A | 10/1993 | Palombo ........................ 372/34 |
| 5,284,790 A | 2/1994 | Karpinski | |
| 5,298,762 A | 3/1994 | Ou ................... 257/13 |
| 5,305,344 A | 4/1994 | Patel | |
| 5,311,530 A | 5/1994 | Wagner et al. ............... 372/36 |
| 5,311,535 A | 5/1994 | Karpinski | |
| 5,325,384 A | 6/1994 | Herb et al. | |
| 5,394,426 A | 2/1995 | Joslin | |
| 5,418,799 A | 5/1995 | Tada | |
| 5,440,577 A | 8/1995 | Tucker | |
| 5,450,430 A | 9/1995 | Chang ........................... 372/38 |
| 5,455,738 A | 10/1995 | Montesano et al. ......... 361/707 |
| 5,497,391 A | 3/1996 | Paoli | |
| 5,504,767 A | 4/1996 | Jamison et al. | |
| 5,521,931 A | 5/1996 | Biegelsen et al. ............ 372/36 |
| 5,526,373 A | 6/1996 | Karpinski | |
| 5,568,498 A | 10/1996 | Nilsson | |
| 5,592,333 A * | 1/1997 | Lewis .................... H01S 3/005 385/124 |
| 5,593,815 A | 1/1997 | Ahn ................... 430/321 |
| 5,627,850 A | 5/1997 | Irwin et al. | |
| 5,644,586 A | 7/1997 | Kawano et al. | |
| 5,661,747 A * | 8/1997 | Hiiro .................... H01S 5/4062 372/98 |
| 5,679,963 A | 10/1997 | Klem et al. ................... 257/46 |
| 5,764,675 A | 6/1998 | Juhala | |
| 5,778,020 A | 7/1998 | Gokay | |
| 5,783,316 A | 7/1998 | Colella et al. | |
| 5,793,784 A * | 8/1998 | Wagshul ............... H01S 5/4062 372/101 |
| 5,802,092 A * | 9/1998 | Endriz .................. G02B 19/0057 372/50.23 |
| 5,812,573 A | 9/1998 | Shiomi et al. | |
| 5,835,515 A | 11/1998 | Huang et al. | |
| 5,835,518 A | 11/1998 | Mundinger et al. ........... 372/50 |
| 5,848,083 A | 12/1998 | Haden et al. .................. 372/36 |
| 5,856,990 A | 1/1999 | Nilsson ........................ 359/344 |
| 5,887,096 A * | 3/1999 | Du ........................ H01S 5/4025 385/47 |
| 5,909,458 A | 6/1999 | Freitas et al. .................... 372/36 |
| 5,913,108 A | 6/1999 | Stephens et al. | |
| 5,923,692 A | 7/1999 | Staskus et al. | |
| 5,930,279 A | 7/1999 | Apollonov et al. ............ 372/50 |
| 5,987,045 A | 11/1999 | Albares ........................ 372/38 |
| 6,031,285 A | 2/2000 | Nishibayashi | |
| 6,101,208 A | 8/2000 | Gokay | |
| 6,208,677 B1 | 3/2001 | Moyer ........................ 372/66 |
| 6,252,179 B1 | 6/2001 | Lauffer ........................ 174/255 |
| 6,281,471 B1 | 8/2001 | Smart ........................ 219/121.62 |
| 6,295,307 B1 | 9/2001 | Hoden et al. ................. 372/36 |
| 6,352,873 B1 | 3/2002 | Hoden et al. ................. 438/28 |
| 6,396,857 B1 | 5/2002 | Labranche | |
| 6,400,513 B1 * | 6/2002 | Southwell ............ G02B 27/123 372/71 |
| 6,424,667 B1 | 7/2002 | Endriz et al. | |
| 6,480,514 B1 | 11/2002 | Lorenzen et al. ............. 372/35 |
| 6,493,148 B1 * | 12/2002 | Anikitchev .......... G02B 27/143 359/618 |
| 6,493,373 B1 | 12/2002 | Boucart ...................... 257/33.069 |
| 6,535,533 B2 | 3/2003 | Lorenzen et al. ............. 372/34 |
| 6,535,541 B1 | 3/2003 | Boucart et al. ................ 372/96 |
| 6,542,531 B2 | 4/2003 | Sirbu ...................... B82Y 20/00 |
| 6,727,117 B1 | 4/2004 | McCoy | |
| 6,865,200 B2 | 3/2005 | Takigawa et al. | |
| 7,016,383 B2 | 3/2006 | Rice | |
| 7,286,359 B2 | 10/2007 | Khbeis et al. | |
| 7,359,413 B2 | 4/2008 | Tzuk et al. ..................... 372/34 |
| 7,529,286 B2 | 5/2009 | Gokay et al. .................. 372/69 |
| 7,539,232 B1 * | 5/2009 | Corcoran ............ H01S 3/0805 372/98 |
| 7,580,189 B2 * | 8/2009 | Urey ................... G02B 3/0062 359/619 |
| 7,660,335 B2 | 2/2010 | Thiagarajan et al. .......... 372/34 |
| 7,864,825 B2 | 1/2011 | Thiagarajan et al. .......... 372/36 |
| 7,944,955 B2 | 5/2011 | Thiagarajan et al. .......... 372/34 |
| 8,017,935 B2 | 9/2011 | Staszewski et al. ............ 257/27 |
| 8,653,550 B2 | 2/2014 | Mastro ..................... H01L 33/40 |
| 8,664,524 B2 | 3/2014 | Gamett ............ H01L 31/02966 |
| 8,848,753 B2 | 9/2014 | Koenning ................ 372/29.021 |
| 9,256,073 B2 * | 2/2016 | Chann ..................... G02B 5/18 |
| 10,120,149 B1 | 11/2018 | Mathai ................... G02B 6/425 |
| 11,108,214 B2 * | 8/2021 | Kobayashi .......... H01S 3/08054 |
| 2001/0017870 A1 | 8/2001 | Hayakawa ..................... 372/40 |
| 2002/0001864 A1 | 1/2002 | Ishikawa et al. | |
| 2002/0009106 A1 | 1/2002 | Miyokawa et al. | |
| 2002/0014631 A1 | 2/2002 | Iwata ............................... 257/89 |
| 2002/0025096 A1 | 2/2002 | Wang et al. ..................... 385/8 |
| 2002/0086483 A1 | 7/2002 | Kim ............................ 438/264 |
| 2002/0086486 A1 | 7/2002 | Tanaka ............... H01L 21/28518 |
| 2003/0116767 A1 | 6/2003 | Kneissl et al. .................. 257/79 |
| 2004/0037340 A1 | 2/2004 | Yanagisawa | |
| 2004/0052280 A1 | 3/2004 | Rice | |
| 2004/0082112 A1 | 4/2004 | Stephens | |
| 2004/0125459 A1 | 7/2004 | Tanitsu et al. ................ 359/619 |
| 2004/0264521 A1 | 12/2004 | Ness et al. | |
| 2005/0095755 A1 | 5/2005 | Nakata et al. | |
| 2005/0232628 A1 | 10/2005 | Von Freyhold et al. ....... 398/41 |
| 2005/0254539 A1 | 11/2005 | Klimek | |
| 2006/0011938 A1 | 1/2006 | Debray ........................ 257/104 |
| 2006/0045144 A1 * | 3/2006 | Karlsen ................ H01S 5/4031 372/98 |
| 2006/0197100 A1 | 9/2006 | Shen ............................ 257/94 |
| 2007/0116079 A1 | 5/2007 | Giniunas et al. ............... 372/69 |
| 2007/0273957 A1 | 11/2007 | Zalevsky ............ G02B 27/1093 |
| 2008/0089380 A1 | 4/2008 | Konig et al. ................... 372/75 |
| 2008/0123710 A1 | 5/2008 | Brick ...................... B82Y 20/00 |

(56) References Cited

U.S. PATENT DOCUMENTS

| | | | |
|---|---|---|---|
| 2008/0130223 A1 | 6/2008 | Nakamura | H02M 7/003 |
| 2008/0170598 A1* | 7/2008 | Kireev | H01S 5/4062 |
| | | | 372/44.01 |
| 2008/0213710 A1 | 9/2008 | Schultz | F23N 1/027 |
| 2008/0259983 A1 | 10/2008 | Trococoli | 372/6 |
| 2009/0015185 A1 | 1/2009 | Yoshida | 318/504 |
| 2009/0090932 A1 | 4/2009 | Bour et al. | 257/103 |
| 2010/0012188 A1 | 1/2010 | Garnett | 136/260 |
| 2011/0051759 A1 | 3/2011 | Telford | 372/35 |
| 2011/0063701 A1* | 3/2011 | Yankov | G02B 6/124 |
| | | | 359/15 |
| 2011/0103409 A1 | 5/2011 | Sipes | G02B 6/4296 |
| 2011/0241549 A1 | 10/2011 | Wootton | 315/111 |
| 2011/0280269 A1 | 11/2011 | Ghang-Hasnain | H01S 5/105 |
| 2012/0114001 A1 | 5/2012 | Fang et al. | 372/45.01 |
| 2012/0153254 A1 | 6/2012 | Mastro | 257/13 |
| 2012/0252144 A1 | 10/2012 | Schroeder et al. | 438/26 |
| 2012/0287958 A1 | 11/2012 | Lell | H01S 5/323 |
| 2013/0016752 A1 | 1/2013 | Lell | H01S 5/323 |
| 2013/0112667 A1* | 5/2013 | Holmgren | G02B 27/0961 |
| | | | 219/121.6 |
| 2013/0259074 A1 | 10/2013 | Newman | H01S 3/04 |
| 2013/0271959 A1 | 10/2013 | Woodgate | G09F 13/04 |
| 2014/0064305 A1* | 3/2014 | Sipes, Jr. | G02B 19/0014 |
| | | | 372/50.23 |
| 2014/0293554 A1 | 10/2014 | Shashkov | 361/748 |
| 2015/0063387 A1 | 3/2015 | Joseph et al. | H01S 5/02438 |
| 2015/0162478 A1 | 6/2015 | Fafard | 257/461 |
| 2015/0207011 A1 | 7/2015 | Gamett | H01L 31/0368 |
| 2015/0207294 A1 | 7/2015 | Brick et al. | H01S 5/10 |
| 2015/0255960 A1 | 9/2015 | Kanskar | H01S 5/4075 |
| 2016/0014878 A1 | 1/2016 | Kilkenny | 257/99 |
| 2016/0147025 A1 | 5/2016 | Sakamoto | |
| 2017/0051884 A1 | 2/2017 | Raring | |
| 2017/0288367 A1 | 10/2017 | Tanigucki | |
| 2017/0338194 A1 | 11/2017 | Gittemeier | |
| 2018/0152000 A1 | 5/2018 | Crawford et al. | H01S 5/02288 |
| 2018/0254606 A1 | 9/2018 | McElkinney et al. | H01S 5/02484 |
| 2018/0261975 A1 | 9/2018 | Pavlov | |
| 2018/0335582 A1 | 11/2018 | Iskige | |
| 2018/0337513 A1 | 11/2018 | Crawford et al. | H01S 5/3095 |
| 2020/0027839 A1 | 1/2020 | Hino | H01L 23/49 |
| 2020/0028332 A1* | 1/2020 | Kobayashi | G02B 3/06 |
| 2020/0075529 A1 | 3/2020 | Otsuka | |

FOREIGN PATENT DOCUMENTS

| | | | |
|---|---|---|---|
| DE | 19518177 | 11/1996 | H01S 3/0941 |
| DE | 10062579 | 6/2001 | |
| DE | 102008040374 | 1/2010 | H01S 5/40 |
| EP | 1439618 | 7/2004 | H01S 5/024 |
| EP | 1452614 | 9/2004 | H01S 5/024 |
| EP | 1811617 | 7/2007 | H01S 5/024 |
| EP | 1887666 | 2/2008 | H01S 5/024 |
| EP | 2110903 | 10/2009 | H01S 5/00 |
| EP | 2305400 | 4/2011 | B22D 19/00 |
| JP | 2002111058 | 4/2002 | H01L 33/00 |
| WO | WO2008006505 | 1/2008 | H01S 5/4062 |
| WO | WO-2008006505 A2 * | 1/2008 | H01S 5/4062 |

OTHER PUBLICATIONS

Machine English translation of WO-2008006505-A2 (Year: 2008).*
Chinese Official Action issued in related Chinese Patent Application Serial No. 201780073945.8, dated Sep. 21, 2020 (16 pages) with translation.
Official Action issued in Applicants' corresponding EPO Application Serial No. 07117048.7-2222, dated Aug. 6, 2009, 4 pages.
Official Action issued in Applicants' corresponding EPO Application Serial No. 07117048.7-2222, dated Nov. 20, 2008, 9 pages.
Intention to Grant issued Applicants' corresponding EP Application Serial No. 09157643.9, dated Apr. 7, 2017, 6 pages.
Official Action issued in Applicants' corresponding EPO Application Serial No. 09157643.9 dated Aug. 22, 2016, 5 pages.
Official Action issued in Applicants' corresponding EPO Application Serial No. 09157643.9, dated Apr. 16, 2014, 2 pages.
European Search Report issued in application No. 09157643.9, dated Aug. 9, 2013 (7 pgs).
European Search Report issued in application No. 20150730.8, dated Jul. 3, 2020 (8 pgs).
Intention to Grant issued in Applicants' corresponding EPO Application Serial No. 16172620.3, dated Jul. 19, 2019, 3 pages.
European Search Report issued in application No. 18173282.7-1211, dated Oct. 8, 2018 (8 pgs).
Intention to Grant issued in Applicants' corresponding EPO Application Serial No. 06845311.7, dated Nov. 9, 2010, 5 pages.
European Search Report issued in application No. 06845311.7, dated Mar. 31, 2010 (9 pgs).
Official Action issued in European application No. 18173282.7-1211, dated Jan. 23, 2020 (6 pgs).
European Seach Report issued in application No. 16172620.3, dated Oct. 25, 2016 (9 pgs).
European Search Report issued in application No. 20150730.8, dated Jul. 3, 2020 (9 pages).
European Supplemental Search Report issued in European Patent Application 17875888.4, dated Jul. 9, 2020 (11 pages).
Feng, et al., "High efficient GaN-based laser diodes with tunnel juction", Application Physics Letters 103, AIP Publishing, LLC, 2013.
Rieprich, et al., "Proceedings in SPIE—Assessment of factors regulating the thermal lens profile and lateral brightness in high power diode lasers", SPIEL ASE, 2017.
Office Action issued in U.S. Appl. No. 15/363,874, dated Jul. 18, 2019 (24 pgs).
Office Action issued in U.S. Appl. No. 15/363,874, dated in Apr. 24, 2018 (10 pgs).
Office Action issued in U.S. Appl. No. 15/363,874, dated Feb. 14, 2019 (13 pgs).
Office Action issued in U.S. Appl. No. 15/363,874, dated Mar. 6, 2020 (12 pgs).
Office Action issued in U.S. Appl. No. 15/363,874, dated Jun. 15, 2020 (12 pgs).
Office Action issued in U.S. Appl. No. 15/363,874, dated Oct. 14, 2020 (11 pgs).
Office Action issued in U.S. Appl. No. 15/363,874, dated Oct. 4, 2018 (14 pgs).
Notice of Allowance issued in U.S. Appl. No. 15/363,874, dated Feb. 2, 2021 (7 pgs).
Office Action issued in U.S. Appl. No. 14/728,923, dated Aug. 9, 2018 (17 pgs).
Office Action issued in U.S. Appl. No. 14/728,923, dated Apr. 19, 2018 (16 pgs).
Office Action issued in U.S. Appl. No. 14/728,923, dated Oct. 2, 2017 (11 pgs).
Office Action issued in U.S. Appl. No. 12/105,126, dated Jul. 23, 2009 (7 pgs).
Office Action issued in U.S. Appl. No. 12/105,126, dated Apr. 24, 2009 (8 pgs).
Notice of Allowance issued in U.S. Appl. No. 12/105,126, dated Sep. 22, 2009 (7 pgs).
Notice of Allowance issued in U.S. Appl. No. 12/648,141, dated Jan. 11, 2011 (11 pgs).
Office Action issued in U.S. Appl. No. 16/539,889, dated Feb. 1, 2021 (18 pgs).
Office Action issued in U.S. Appl. No. 16/539,889, dated Oct. 21, 2020 (16 pgs).
Office Action issued in U.S. Appl. No. 16/539,889, dated Jul. 1, 2020 (19 pgs).
Office Action issued in U.S. Appl. No. 11/299,029, dated Aug. 22, 2008 (8 pgs).
Office Action issued in U.S. Appl. No. 16/540,961, dated Nov. 17, 2020 (13 pgs).
Office Action issued in U.S. Appl. No. 16/540,961, dated Aug. 5, 2020 (9 pgs).

(56) References Cited

OTHER PUBLICATIONS

Office Action issued in U.S. Appl. No. 11/829,030, dated Nov. 30, 2009 (16 pgs).
Office Action issued in U.S. Appl. No. 11/829,030, dated Jun. 24, 2009 (13 pgs).
Office Action issued in U.S. Appl. No. 11/829,030, dated Apr. 3, 2009 (13 pgs).
Office Action issued in U.S. Appl. No. 11/829,030, dated Nov. 12, 2008 (12 pgs).
Notice of Allowance issued in U.S. Appl. No. 11/829,030, dated Aug. 30, 2010 (7 pgs).
Giri et al, "Influence of Hot Electron Scattering and Electron-Phonon Interactions on Thermal Boundary Conductance at Metal/Nonmetal Interfaces" Journal of Heat Transfer, vol. 136, dated Sep. 2014 (6 pgs).
Martin et al., "Thermal Behavior of Visible AlGaInP—GaInP Ridge Laser Diodes" IEEE Journal of Quantum Electronics, vol. 28, No. 11, dated Nov. 1992 (7 pgs).
Monachon , C., "Thermal Boundary Conductance Between Metals and Dielectrics" thesis for the graduation of Doctor of Science, Federal Institute of Technology in Lausanne, 2013 (251 pgs).
Nekorkin et al., "Nonlinear mode mixing in dual-wavelength semiconductor lasers with tunnel junctions", Applied Physics Letters 90, 171106 (2007) (3 pgs).
Notice of Allowance issued in U.S. Appl. No. 15/601,820, dated Jun. 11, 2019 (8 pgs).
Rieprich et al., "Assessment of Factors Regulating the Thermal Lens Profile and Lateral Brightness in High Power Diode Lasers" Proc of SPIE, vol. 10085, No. 1008502-1, dated 2017 (10 pgs).
Zhang et al., "Thermal Transport Across Metal-Insulator Interface Via Electron-Phonon Interaction," Journal of Physics Condensed Matter, dated Oct. 2013 (15 pgs).
International Preliminary Report on Patentability issued in application No. PCT/US2017/057209, dated Jun. 4, 2019 (8 pgs).
International Search Report and Written Opinion issued in corresponding PCT Patent Appln. Serial No. PCT/US17/57209 dated Jan. 16, 2018, 10 pgs.
International Search Report and Written Opinion issued in corresponding PCT Patent Appln. Serial No. PCT/US19/46410 dated Nov. 8, 2019, 7 pgs.
Office Action issued in U.S. Appl. No. 15/601,820, dated Feb. 27, 2019 (26 pages).
Office Action issued in U.S. Appl. No. 15/601,820, dated Aug. 27, 2018 (28 pages).
Yonkee, B.P., et al., "Demonstration of a III-nitride edge-emitting laser diode utilizing a GaN tunnel junction contact", Optics Express, vol. 24, No. 7, pp. 7816-7822, Apr. 2016.
Young, Lee W., Authorized officer, International Searching Authority, Written Opinion of the International Searching Authority, International Patent Application Serial No. PCT/US06/47448, completion date: Oct. 30, 2008.
Young, Lee W., Authorized officer, International Searching Authority, International Search Report, International Patent Application U.S. Appl. No. PCT/US06/47448, search date: Nov. 1, 2008.
Polyimide properties data sheet, www. mit.edu, Oct. 27, 2004 (Year 2004).
RO30000 Series Laminates, Rogers Corporation Data sheet (year 2020).
Sunstone, FR-4 PCB Material, Mar. 14, 2017 (Year 2017).
Chen et al., High-T Polymer Dec. 25, 2017 (Year 2017).
Robin K. Huang, Bien Chann, James Burgess, Michael Kaiman, Robert Overman, John D. Glenn, Parviz Tayebati "Direct diode lasers with comparable beam quality to fiber, CO2, and solid state lasers", Proc. SPIE 8241, High-Power Diode Laser Technology and Applications X, 824102 (Feb. 8, 2012);https://doi.org/10.1117/12.907161 (abstract only).
Official Action issued in corresponding U.S. Appl. No. 16/539,889, dated May 11, 2021, 21 pages.
International Preliminary Report on Patentability issued in International Application Serial No. PCT/US2019/046410, dated Feb. 16, 2021, 6 pages.
European Search Report issued in corresponding European Patent Application Serial No. EP 20 19 646.6, dated Feb. 16, 2021, 7 pages.
U.S. Appl. No. 11/829,030, filed Jul. 26, 2007.
U.S. Appl. No. 09/556,767, filed Apr. 24, 2020.
U.S. Appl. No. 09/170,491, filed Oct. 13, 1998.
U.S. Appl. No. 12/105,126, filed Apr. 17, 2008.
U.S. Appl. No. 12/648,141, filed Dec. 28, 2009.
U.S. Appl. No. 14/728,923, filed Jun. 2, 2015.
U.S. Appl. No. 15/167,748, filed May 27, 2016.
U.S. Appl. No. 15/363,874, filed Nov. 29, 2016.
U.S. Appl. No. 15/601,820, filed May 22, 2017.
U.S. Appl. No. 11/299,029, filed Dec. 9, 2005.
U.S. Appl. No. 16/539,889, filed Aug. 13, 2019.
U.S. Appl. No. 16/734,133, filed Jan. 3, 2020.
U.S. Appl. No. 16/540,961, filed Aug. 14, 2019.
U.S. Appl. No. 17/022,767, filed Sep. 16, 2020.
Notice of Allowance issued in U.S. Appl. No. 16/734,133, dated Dec. 3, 2021 (9 pgs).
Office Action issued in U.S. Appl. No. 16/895,961, dated Dec. 9, 2022 (27 pgs).

\* cited by examiner

COHERENT BEAM COUPLER

CROSS REFERENCE TO RELATED APPLICATION

This application claims benefit of U.S. Provisional Application Ser. No. 62/858,743 filed Jun. 7, 2019 and titled "Coherent Beam Coupler," the entire disclosure of which is incorporated herein by reference.

FIELD OF THE DISCLOSURE The present disclosure is generally related to laser beam combiners and more particularly is related to coherent laser beam combiners.

BACKGROUND OF THE DISCLOSURE

Scaling output powers of diode lasers requires combining the output of multiple laser diodes emitters in a single laser diode array and further combining the outputs of multiple laser diode arrays. While power scaling can be achieved by directing the outputs of all the laser emitters in a laser diode array in the same direction, this typically produces an incoherent output beam with significantly degraded beam brightness. The incoherent behavior arises from the lack of optical coupling between laser emitters in the array. Coherent behavior requires that light generated in each emitter be cross coupled with all of the other emitters in the laser diode array. While several approaches for cross coupling have been demonstrated they have come at the penalty of loss in overall efficiency, significant complexity, or lack of scalability. The limitations have curtailed the wide application of power scaling using these methods.

Certain applications, such as semiconductor lithography, machining, laser fabrication, and annealing, require high power laser beams with high brightness. Thus, a heretofore unaddressed need exists in the industry to address the aforementioned deficiencies and inadequacies.

SUMMARY OF THE DISCLOSURE

Embodiments of the present disclosure provide an apparatus for coherently beam coupling a laser diode array. Briefly described, in architecture, one embodiment of the apparatus, among others, can be implemented as follows. A coherent beam coupled laser diode array includes an array of laser diodes. Each diode emits a beam propagating along a beam path. An array of collimation optics is included. Each of the collimation optics collimates one beam. A first lenslet array is included. Each lenslet refracts a portion of one beam and a portion of a different beam from the array. A partially reflecting mirror is included. A first portion of each beam propagates through the partially reflecting mirror and a second portion of each beam is reflected back toward the first lenslet array. The second portion of each beam reflected propagates back through the first lenslet array and the collimation optics and into one of the diodes in the array of laser diodes, thereby creating an optical cross coupling. A second lenslet array collimates each beam propagating through each lenslet to form a single laser beam.

In one aspect of the array, the second portion of each beam is reflected into a diode adjacent to the diode from which it was emitted. In this aspect, a beam emitted from the adjacent diode includes characteristics of the second portion of each beam reflected into the adjacent diode. Additionally, the beam emitted from the adjacent diode propagates through the collimation optics, first lenslet array, partially reflecting mirror, and second lenslet array to form the single laser beam.

In another aspect of the array, the lenslets in the first and second lenslet arrays have a pitch smaller than a pitch of the collimation optics. In this aspect, the pitch of the lenslets in the first and second lenslet arrays is one-half the pitch of the collimation optics.

In another aspect of the array, lenslets at exterior portions of the first and second lenslet arrays are planar and have a pitch of about one-half a width of each beam at the collimation optics.

In another aspect of the array, at least one surface of the first and second lenslet arrays is a planar surface. In this aspect, the at least one planar surface is a partially reflecting surface.

In another aspect of the array, the laser diodes operate in a single later and transverse mode.

In another aspect of the array, the partially reflecting mirror is positioned behind the second lenslet array.

The present disclosure can also be viewed as providing methods of optically cross coupling a laser diode array. In this regard, one embodiment of such a method, among others, can be broadly summarized by the following steps: emitting a plurality of laser beams from an array of laser diodes, each diode emitting a beam; collimating each of the plurality of beams with an array of collimation optics, wherein each of the collimation optics collimates one beam emitted from the array of laser diodes; refracting a first portion of each beam with a first lenslet array, wherein the first portion of each beam is refracted by one lenslet within the first lenslet array; refracting a second portion of each beam with the first lenslet array, wherein the second portion of each beam is refracted by a different lenslet than the first portion; providing a partially reflecting mirror, wherein a first portion of each refracted beam propagates through the partially reflecting mirror and a second portion of each refracted beam is reflected back toward the first lenslet array, and wherein the second portion of each refracted beam propagates back through the first lenslet array and the collimation optics and into one of the diodes in the array of laser diodes, thereby creating an optical cross coupling; and providing a second lenslet array, wherein the second lenslet array collimates each beam propagating through each lenslet to form a single laser beam.

In one aspect of the method, the second portion of each beam is reflected into a diode adjacent to the diode from which it was emitted. In this aspect, a beam emitted from the adjacent diode includes characteristics of the second portion of each beam reflected into the adjacent diode. Additionally, the beam emitted from the adjacent diode propagates through the collimation optics, first lenslet array, partially reflecting mirror, and second lenslet array to form the single laser beam.

In another aspect of the method, the lenslets in the first and second lenslet arrays have a pitch smaller than a pitch of the collimation optics. In this aspect, the pitch of the lenslets in the first and second lenslet arrays is one-half the pitch of the collimation optics.

In another aspect of the method, lenslets at exterior portions of the first and second lenslet arrays are planar and have a pitch of about one-half a width of each beam at the collimation optics.

The present disclosure can also be viewed as providing an apparatus for coherently beam coupling a laser diode array. Briefly described, in architecture, one embodiment of the apparatus, among others, can be implemented as follows. A coherent beam coupled laser diode array includes an array of laser diodes. Each diode emits a beam propagating along a beam path. An array of collimation optics is included. Each of the collimation optics collimates one beam. A first lenslet array is included. A first portion of each beam is refracted by one lenslet within the first lenslet array. A second portion of each beam is refracted by a different lenslet within the first lenslet array. A partially reflecting mirror is included. A first portion of each beam propagates through the partially reflecting mirror and a second portion of each beam is reflected back toward the first lenslet array. The second portion of each beam reflected propagates back through the first lenslet array and the collimation optics and into one of the diodes in the array of laser diodes, thereby creating an optical cross coupling. A second lenslet array collimates each beam propagating through each lenslet to form a single laser beam.

In one aspect of the array, the second portion of each beam is reflected into a diode adjacent to the diode from which it was emitted. In this aspect, a beam emitted from the adjacent diode includes characteristics of the second portion of each beam reflected into the adjacent diode. Additionally, the beam emitted from the adjacent diode propagates through the collimation optics, first lenslet array, partially reflecting mirror, and second lenslet array to form the single laser beam.

In another aspect of the array, the lenslets in the first and second lenslet arrays have a pitch smaller than a pitch of the collimation optics. In this aspect, the pitch of the lenslets in the first and second lenslet arrays is one-half the pitch of the collimation optics.

In another aspect of the array, lenslets at exterior portions of the first and second lenslet arrays are planar and have a pitch of about one-half a width of each beam at the collimation optics.

The present disclosure can also be viewed as providing an apparatus for coherently beam coupling a laser diode array. Briefly described, in architecture, one embodiment of the apparatus, among others, can be implemented as follows. A coherent beam coupled laser diode array includes an array of laser diodes. Each diode emits a beam propagating along a beam path. An array of collimation optics is included. Each of the collimation optics collimates one beam. A first lenslet array is included. Each lenslet refracts a portion of one beam and a portion of a different beam from the array. A second lenslet array collimates each beam propagating through each lenslet. A wavelength selective element is included. A portion of each beam having a selected wavelength propagates through the wavelength selective element to form a single beam, thereby creating an optical cross coupling. Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
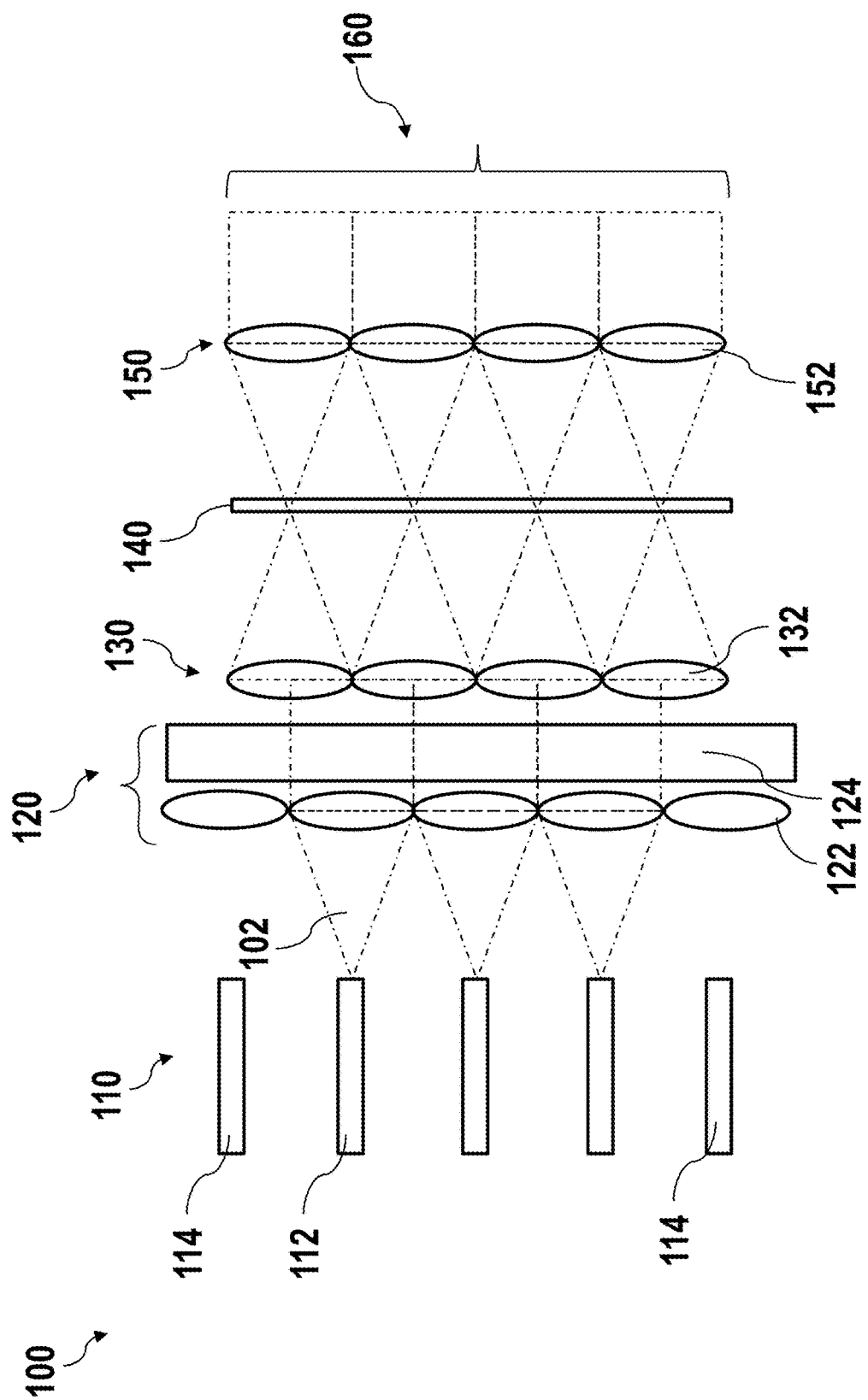
FIG. 1 is a cross-sectional illustration of a coherent beam coupled laser diode array, in accordance with a first exemplary embodiment of the present disclosure.

FIG. 1 is a cross-sectional illustration of a coherent beam coupled laser diode array 100, in accordance with a first exemplary embodiment of the present disclosure. A coherent beam coupled laser diode array 100 (hereinafter "array" 100) includes an array of laser diodes 110. Each diode 112 emits a beam 102 propagating along a beam path. An array 120 of collimation optics is included. Each of the collimation optics 122, 124 collimates one beam 102. A first lenslet array 130 is included. Each lenslet 132 refracts a portion of one beam 102 and a portion of a different beam 102 from the array 110. A partially reflecting mirror 140 is included. A first portion of each beam 102 propagates through the partially reflecting mirror 140 and a second portion of each beam 102 is reflected back toward the first lenslet array 130. The second portion of each beam 102 reflected propagates back through the first lenslet array 120 of the collimation optics and into one of the diodes 112 in the array of laser diodes 110, thereby creating an optical coupling. A second lenslet array 150 collimates each beam propagating through each lenslet 152 to form a single laser beam 160.

The array 100 includes an array of laser diodes 110. The array of laser diodes 110 may include any number and orientation of laser diodes 112 suitable for the application. The laser diodes 112 may be individually addressable or addressable as a group. The laser diodes 112 may have any suitable wavelength, operating power and pulse width desired. In one example, the laser diodes 112 may include visible and infrared lasers operating at wavelengths between 400 nm and 12 um. For ease of illustration, FIG. 1 shows a 2-dimensional array 110 having 5 laser diodes 112, 114. However, any number of laser diodes may be included within the scope of this disclosure. The diodes on the interior of the array 110 are shown as laser diodes 112. The diodes on the exterior of the array 110 are shown as laser diodes 114. The beams 102 given by the exterior diodes 114 may propagate through different aspects of the array 120 of collimation optics, first lenslet array 130, and second lenslet array 150 than the interior diodes 112. This is discussed in greater detail in FIG. 9, below.

Each diode 112, 114 may emit a beam 102 propagating along a beam path. Each beam 102 may vary in beam width and divergence angle from each of the other beams 102. The beam path may be the optical path travelled by each beam 102, which may be through each of the optical elements 120, 130, 140, 150 as described herein. In one example, each diode 112, 114 may operate in a single lateral and transverse mode.

An array 120 of collimation optics is included. Each of the collimation optics 122, 124 collimates one beam 102 in two orthogonal directions. The array 120 of collimation optics may be sized and numbered to correspond with the number of laser diodes 112, 114 in the laser diode array 110. For instance, if the laser diode array 110 includes 5 laser diodes 112, 114, the array 120 of collimation optics may include 5 sets of collimation optics 122, 124. The collimation optics 122, 124 may include one or more elements to collimate the beams 102 from the laser diodes 112, 114. In one example, this may include a number of refractive lenses 122 and one or more plane parallel plates 124. The number of refractive lenses 122 may correspond to the number of diodes 112, 114. A single plane parallel plate 124 may cover all of the diodes 112, 114. In another example, any other suitable number and combination of collimation optics may be used.

A first lenslet array 130 is included. Each lenslet 132 refracts a portion of one beam 102 and a portion of a different beam 102 from the array 110. The lenslet array 130 may include a number of lenslets 132 aligned in the same plane and having the same radii of curvature. The number of lenslets 132 may be correlated with the number of laser diodes 112, 114, which may be determined by the position of the lenslets 132 in relation to the laser diodes 112, 114. In one example, the lenslet array 130 may be offset from the laser diode array 110 such that the lenslets 132 are located between the beam paths of two adjacent beams 102. For example, FIG. 1 shows each of 4 lenslets 132 located between the 5 laser diodes 112, 114. Each lenslet 132 is located in the path of 2 adjacent beams 102 (beams are not shown for exterior diodes 114 for simplicity of illustration, as discussed above). In this way, each lenslet 132 refracts a portion of each of the 2 beams 102. Considered another way, each beam 102 is refracted by 2 different lenslets 132. This may cause different portions of each beam 102 to be refracted to different points along the beam path. This is shown in greater detail in FIGS. 2-8, below. In another example the exterior surface of lenslet array 130 may be planar and act as a partially reflecting mirror. This is discussed further in FIG. 11.

A partially reflecting mirror 140 is included. The partially reflecting mirror 140 may be any suitable type and number of partially reflecting mirrors 140. In one example, the partially reflecting mirror 140 may be a half-silvered mirror that allows approximately one half of each beam 102 impingent upon the partially reflecting mirror 140 to pass through, while the other half is reflected back into the array 100. In another example, the partially reflecting mirror 140 may allow a greater or smaller amount of the beams 102 to pass through upon impinging upon the partially reflecting mirror 140. The partially reflecting mirror 140 may be suitably reflective and transmissive for the spectra of light created by the array of laser diodes 110.

A first portion of each beam 102 propagates through the partially reflecting mirror 140 and a second portion of each beam 102 is reflected back toward the first lenslet array 130. The second portion of each beam 102 reflected propagates back through the first lenslet array 130 and the array 120 of collimation optics and into one of the diodes 112 in the array of laser diodes 110, thereby creating an optical cross coupling. This is shown in greater detail in FIGS. 2-8. The cross coupling causes a coherent beam 102 to be emitted by each diode 112, 114. The more coherent beams 102 pass through the array 100 in an iterative loop, creating coherent beams 102 that pass through the partially reflecting mirror 140 and reflect back into the array 100 to continue the optical cross coupling. This cross coupling forces coherent operation of all the emitters in the array 100.

A second lenslet array 150 collimates each beam propagating through each lenslet 152 to form a single laser beam 160. The second lenslet array 150 may be substantially similar to the first lenslet array 130 and may perform a collimation on the portions of the beams 102 passing through the partially reflecting mirror 140. This may yield a single laser beam 160 over the desired area. The single laser beam 160 may be coupled, collimated, and coherent due to the process described herein.

FIGS. 2-8 are cross-sectional illustrations showing the propagation of a laser beam 102 through the coherent beam coupled laser diode array 100 of FIG. 1, in accordance with the first exemplary embodiment of the present disclosure. For ease of illustration, the propagation of a single laser beam 102 is shown. In operation, all laser beams 102 within the array 100 may propagate in a substantially similar manner. It should be noted that the laser beams 102 emitted by the exterior diodes 114 shown in FIG. 1 are not illustrated for simplicity. Propagation of those beams is discussed in greater detail in FIG. 9, below.

Figure 2:
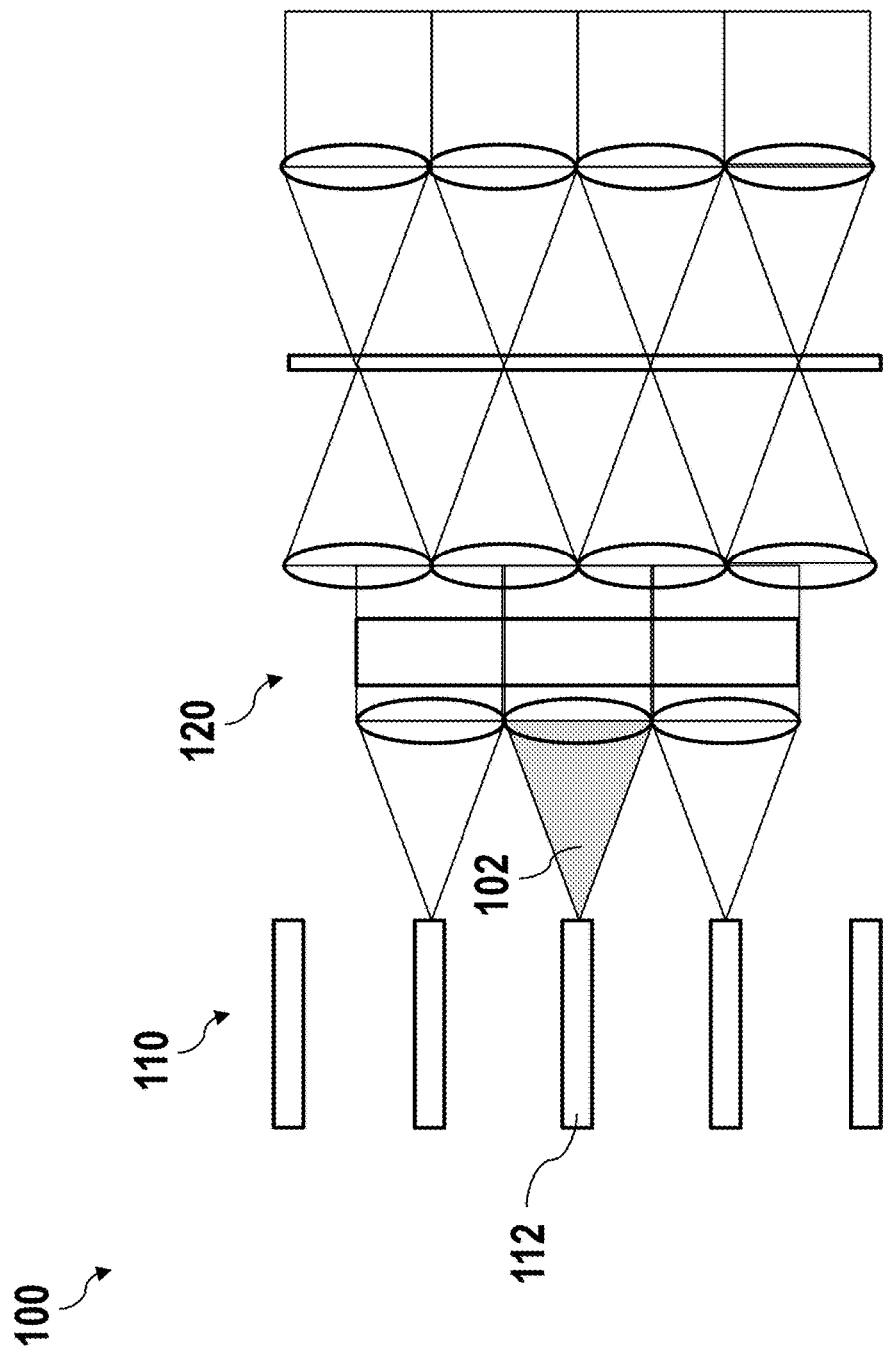
FIGS. 2-8 are cross-sectional illustrations showing the propagation of a laser beam through the coherent beam coupled laser diode array of FIG. 1, in accordance with the first exemplary embodiment of the present disclosure.

FIG. 2 shows the array 100 of FIG. 1. A laser beam 102 is emitted by a laser diode 112. The laser beam 102 propagates along a beam path through the optical components of the array 100, including the array 120 of collimation optics. The laser beam 102 may expand to substantially fill the entrance pupil of the array 120 of collimation optics.

Figure 3:
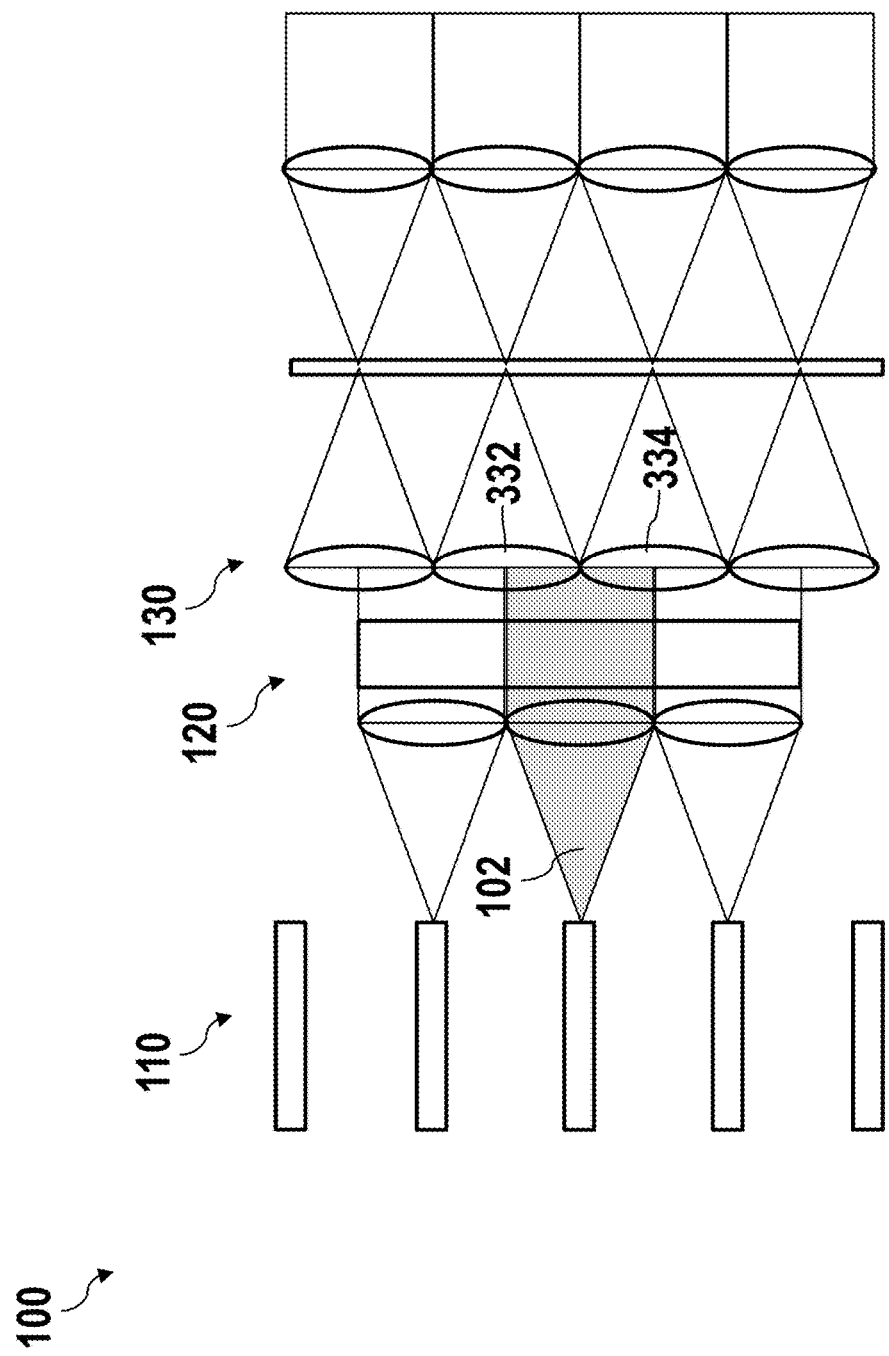

FIG. 3 shows the laser beam 102 being collimated by the array 120 of collimation optics. The collimated beam 102 may propagate through the array 120 of collimation optics to the first lenslet array 130. Since the first lenslet array 130 is offset from the laser diode array 100, each lenslet refracts two beams. Put another way, each beam is refracted by two lenslets. As shown in FIG. 3, the beam 102 is refracted by lenslets 332 and 334. A first portion of the beam 102 propagates through lenslet 332, while a second portion of the beam 102 propagates through lenslet 334.

Figure 4:
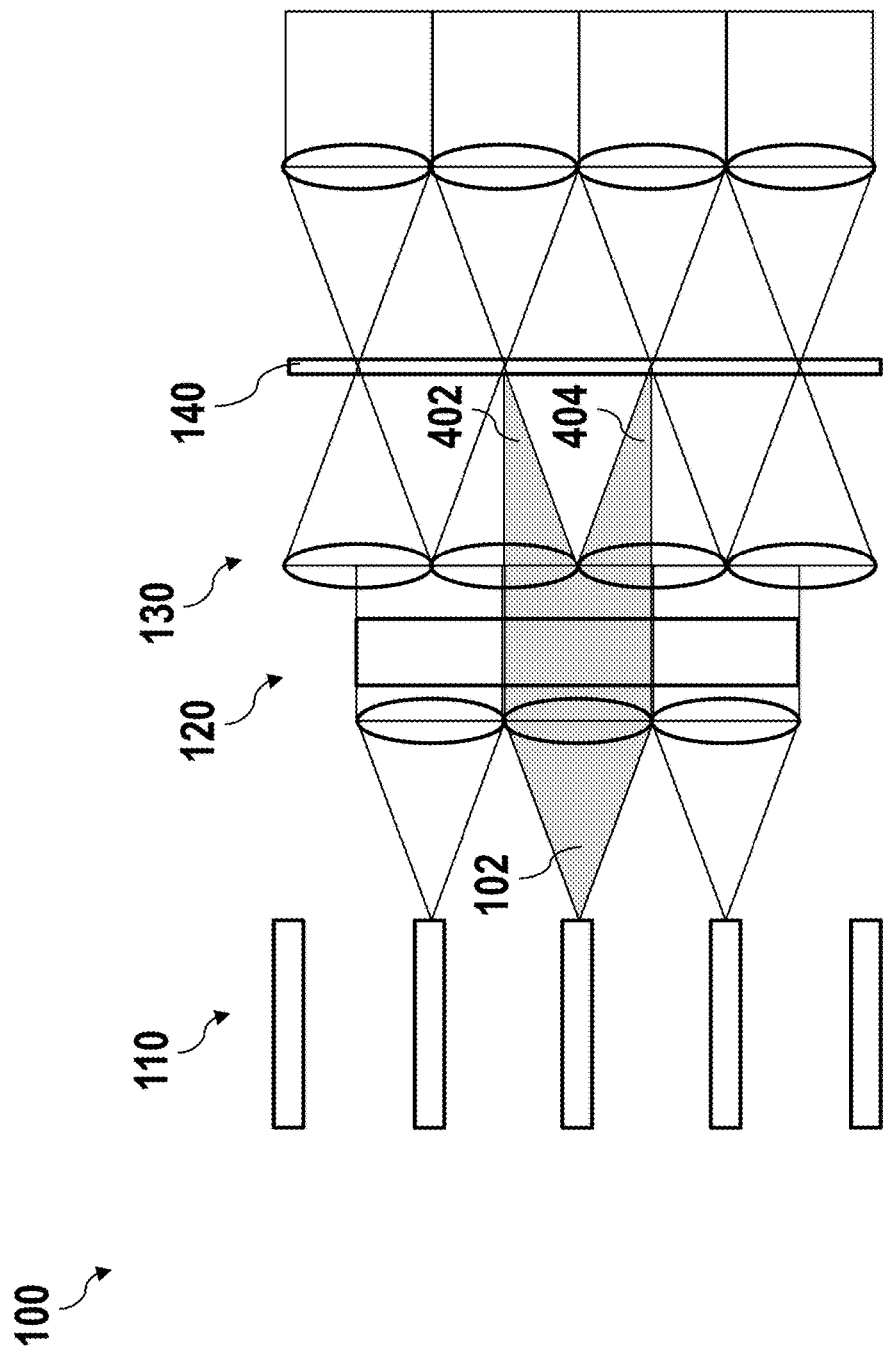

FIG. 4 shows the laser beam 102 propagating through the first lenslet array 130 and specifically, through lenslets 332 and 334 (shown in FIG. 3). This separates the beam 102 into two refracted beams 402, 404 separated spatially by the lenslets. The refracted beams 402, 404 are directed to spatially separated portions of the partially reflecting mirror 140.

Figure 5:
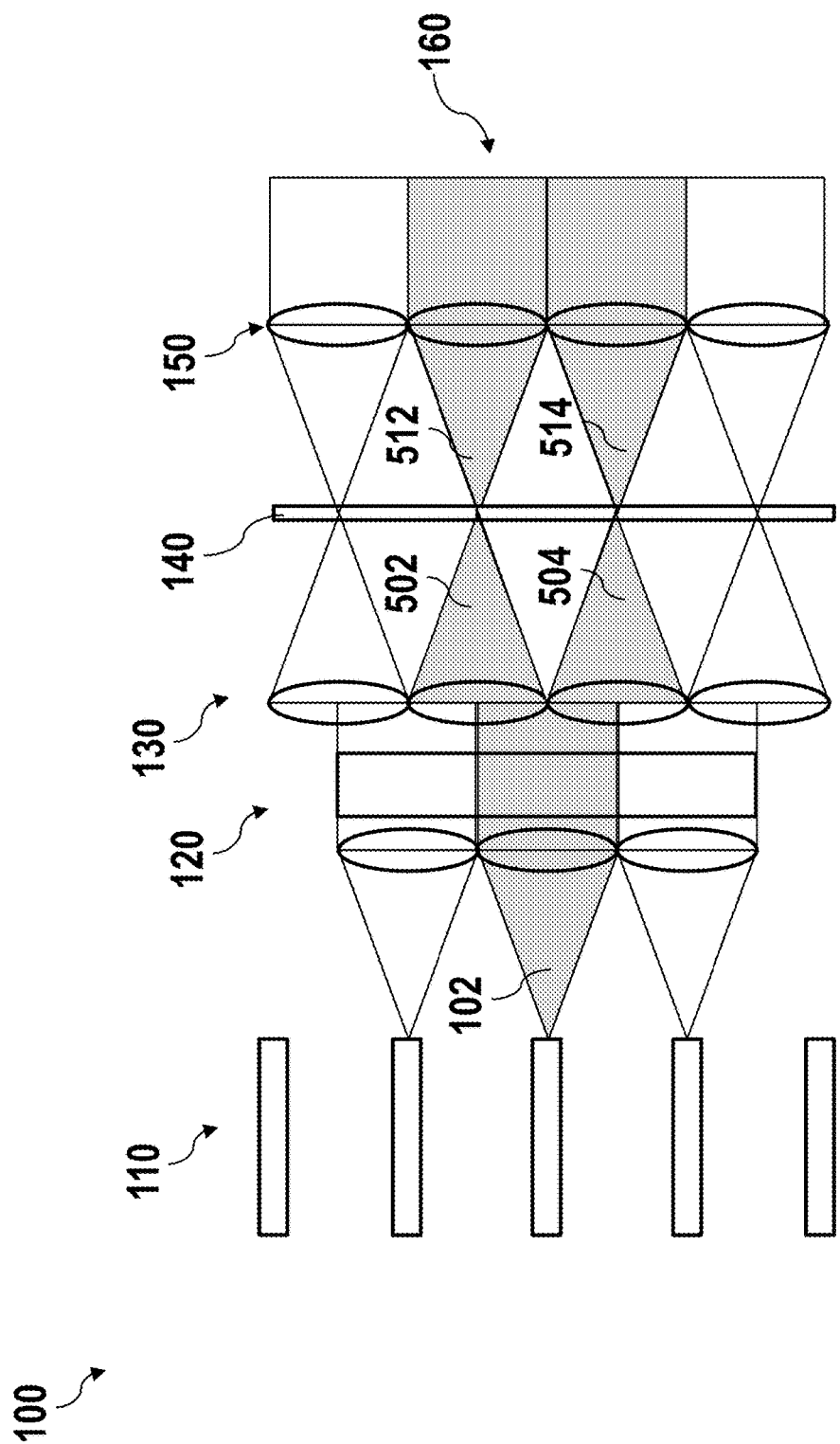

FIG. 5 shows the two refracted beams 402, 404 partially reflected as reflected beams 502, 504. The reflected beams 502, 504 propagate back through the array 100. The refracted beams 402, 404 are also partially transmitted as transmitted beams 512, 514. The transmitted beams 512, 514 may be refracted through the second lenslet array 150 to form a portion of the single beam 160. The reflected beams 502, 504 may propagate back through a different portion of the lenslet 332, 334 (shown in FIG. 3) than it propagated through in FIG. 3 due to the spatial displacement of the reflected beams 502, 504. As shown in FIGS. 3-5, beam 102 initially propagates through a bottom portion of lenslet 332 and a top portion of lenslet 334. Beam 102 is refracted by the lenslets 332, 334 and split into refracted beams 402, 404. Beams 402 and 404 are partially reflected by the partially reflecting mirror 140 and propagate through a top portion of lenslet 332 and a bottom portion of lenslet 334.

Figure 6:
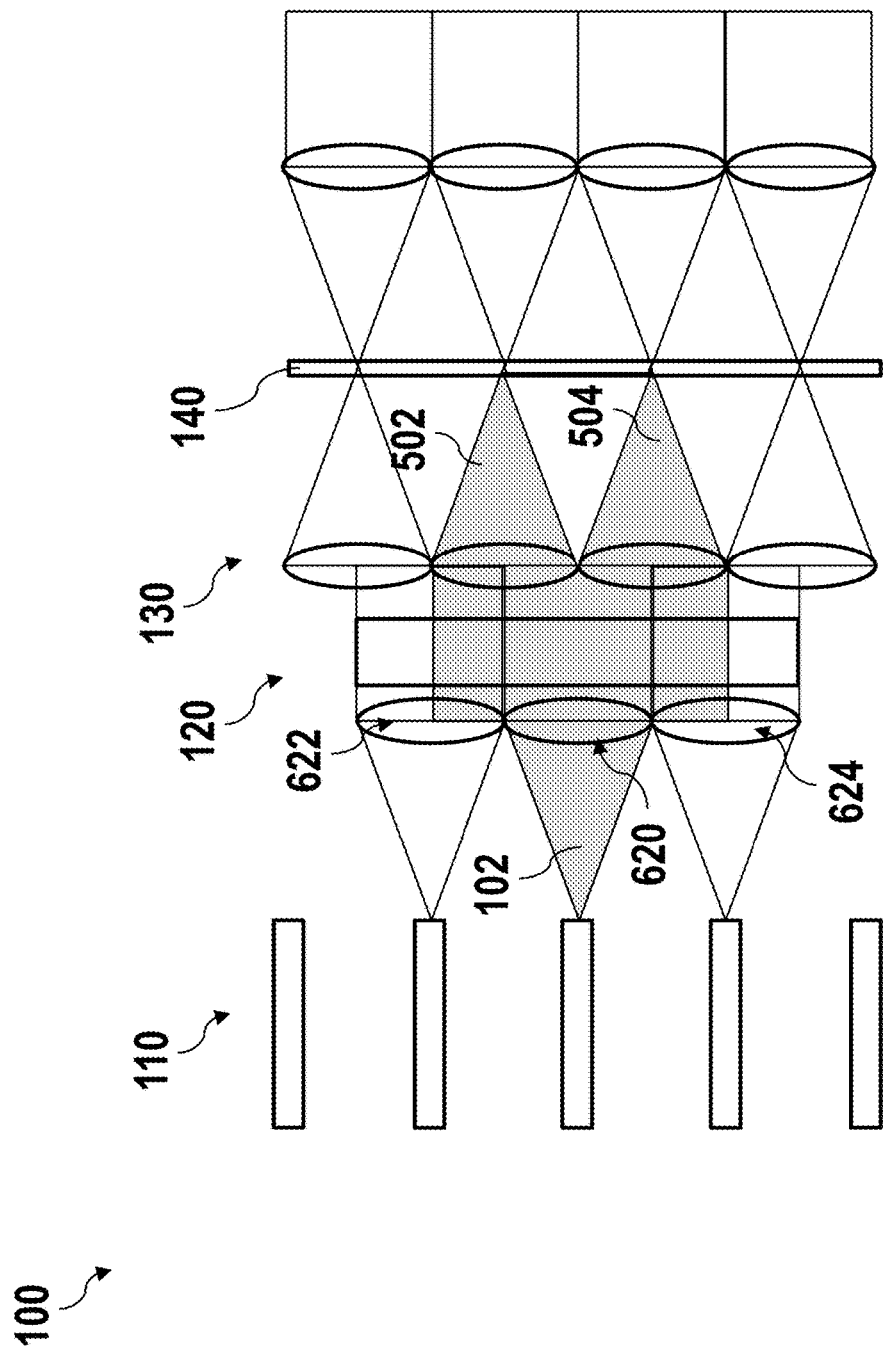

FIG. 6 shows the reflected beams 502, 504 propagating back through the array of collimation optics and toward the laser diode array. It should be noted that, due to the spatial displacement of the reflected beams 502, 504 from the original beam 102, the reflected beams 502, 504 are directed through a different portion of the array 120 of collimation optics than the original beam 102. In the example shown in FIG. 6, the original beam 102 is initially directed through a set of collimation optics 620. However, the reflected beams 502, 504 are directed through a set of collimation optics 622 and 624, respectively. These sets of collimation optics 622, 624 may be adjacent to the set of collimation optics 620 the original beam 102 was directed through. In one example, the adjacent sets of collimation optics 622, 624 may direct the reflected beams 502, 504 into adjacent laser diodes.

Figure 7:
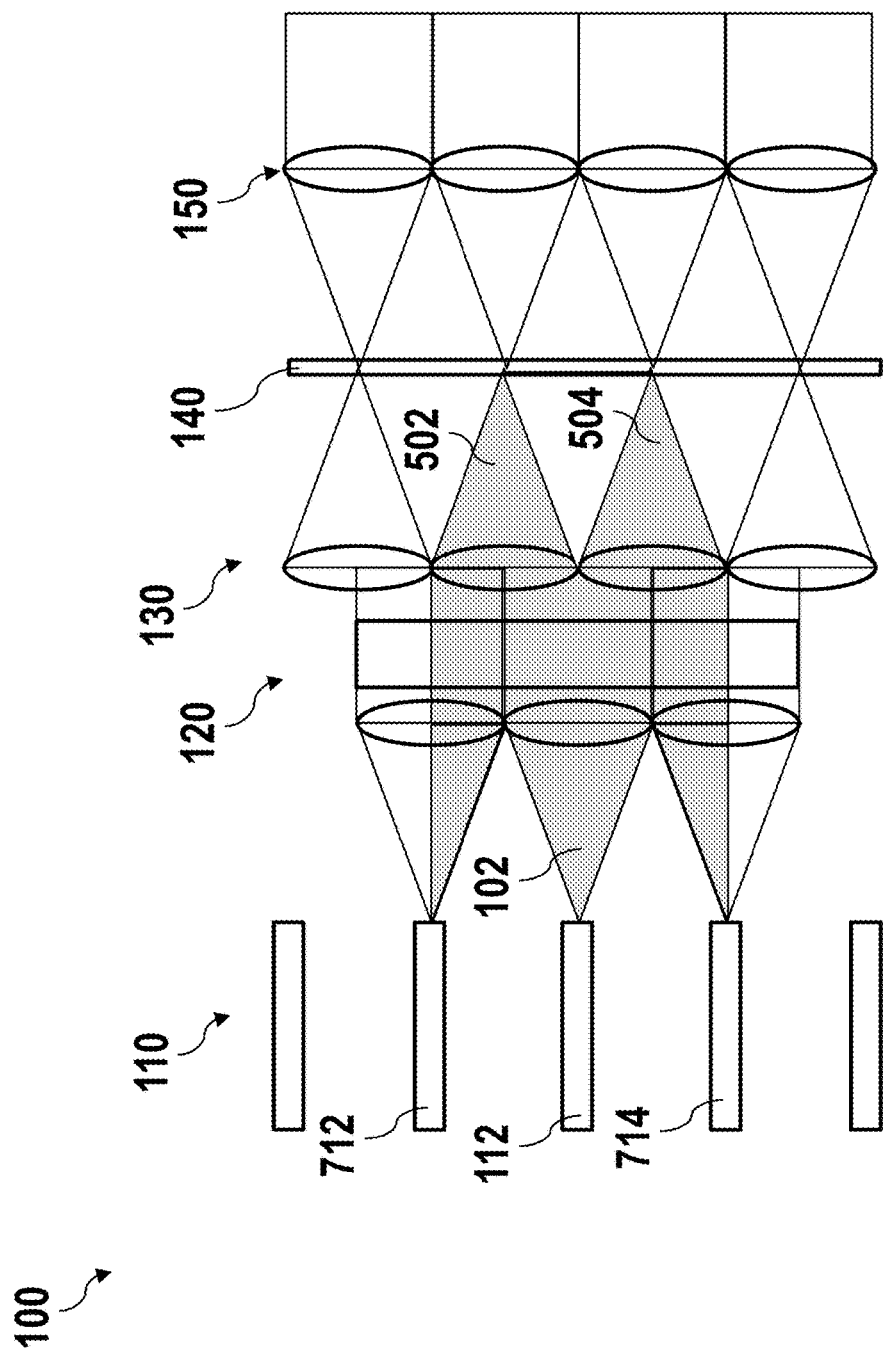

FIG. 7 shows the reflected beams 502, 504 propagating back into laser diodes 712, 714, respectively. It should be noted that, due to the spatial displacement of the reflected beams 502, 504 from the original beam 102, the reflected beams 502, 504 are directed into different laser diodes 712, 714 than the diode 112 from which the original beam 102 was emitted. In one example, the laser diodes 712, 714 may be adjacent to the original laser diode 112. In the example shown in FIG. 7, the adjacent laser diodes 712, 714 are above and below the original laser diode 112, respectively.

Figure 8:
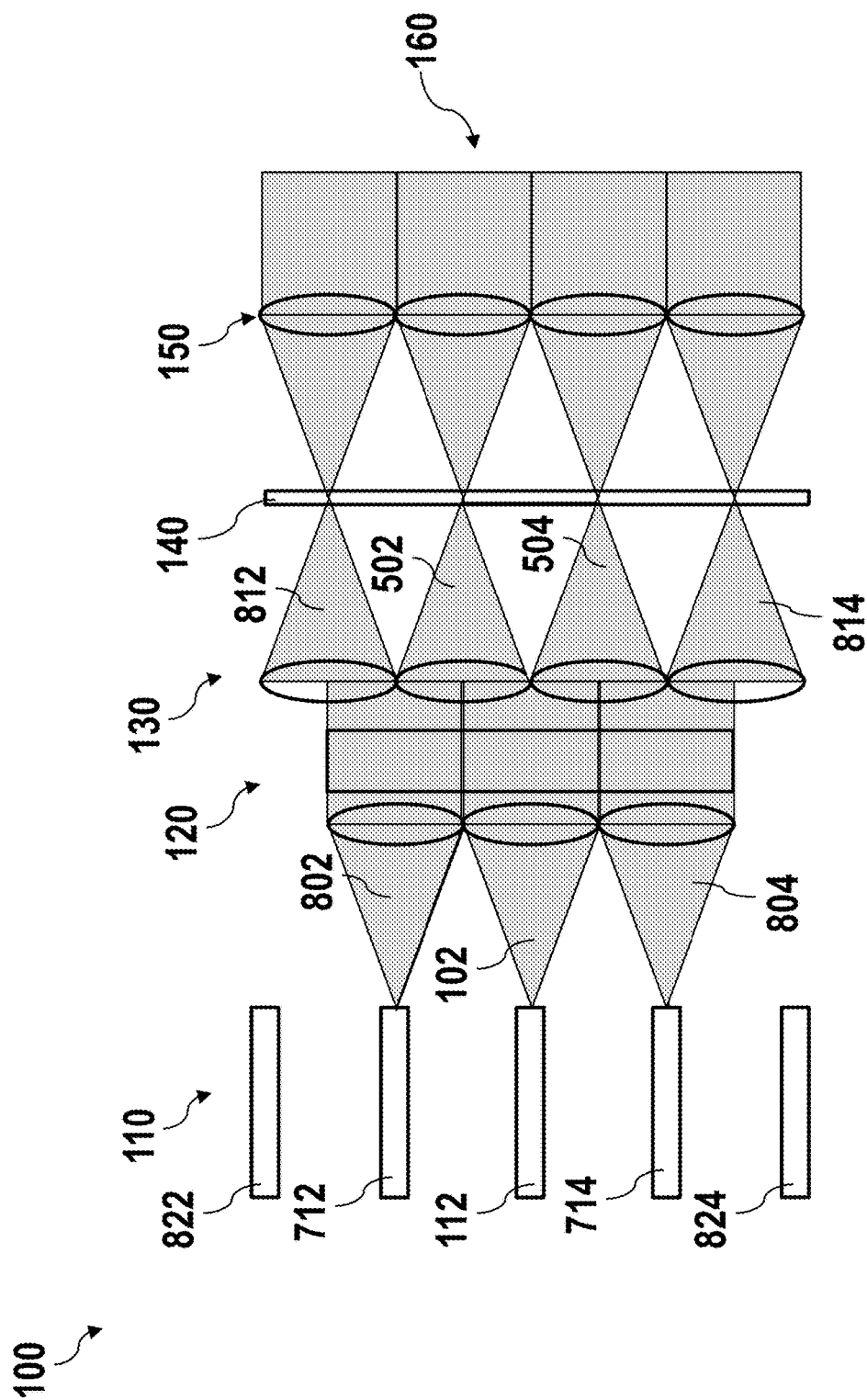

FIG. 8 shows the propagation of beams 802, 804 from the adjacent laser diodes 712, 714. The reflected beams 502, 504 directed into adjacent laser diodes 712, 714 may create an optical cross coupling in the laser diodes 712, 714. Beams 802, 804 may include the spatial and frequency characteristics of reflected beams 502, 504, respectively, which were directed into the adjacent laser diodes 712, 714. Beams 802, 804 may propagate through the components of the array 100, including the array 120 of collimation optics, first lenslet array 130, partially reflecting mirror 140, and second lenslet array 150. A portion of beams 802, 804 may be transmitted by the partially reflecting mirror 140 and may continue to form the single beam 160 on the image plane. The portions of beams 802, 804 transmitted may include the characteristics of the original beam 102, as it was optically coupled back into the adjacent laser diodes 712, 714. A portion of beams 802, 804 may be reflected by the partially reflecting mirror 140 and may become reflected beams 812, 814. These reflected beams 812, 814 may propagate backward through the components of the array 100 as the reflected beams 502, 504 do in FIGS. 5-7. The reflected beams 812, 814 may be directed through different portions of the first lenslet array 130 and array 120 of collimation optics as shown in FIGS. 5-7 relative to reflected beams 502, 504. The reflected beams 812, 814 may be directed to adjacent lenslets, adjacent sets of collimation optics, and finally, to adjacent laser diodes 822, 824. This may create an optical cross coupling wherein beams emitted from the adjacent laser diodes 822, 824 have the characteristics of beams 802, 804 and ultimately, beam 102. This iterative process may continue for the entire operation of the laser diode array 110.

Ultimately, portions of the beams emitted from each laser diode in the laser diode array 110 may be fed back into every other laser diode in the laser diode array 110. This may cause the time-averaged output of all of the beams to resemble each other, as each beam will include characteristics of every other beam. The resultant single beam 160 formed at the image plane may, in turn, be coherent.

Figure 9:
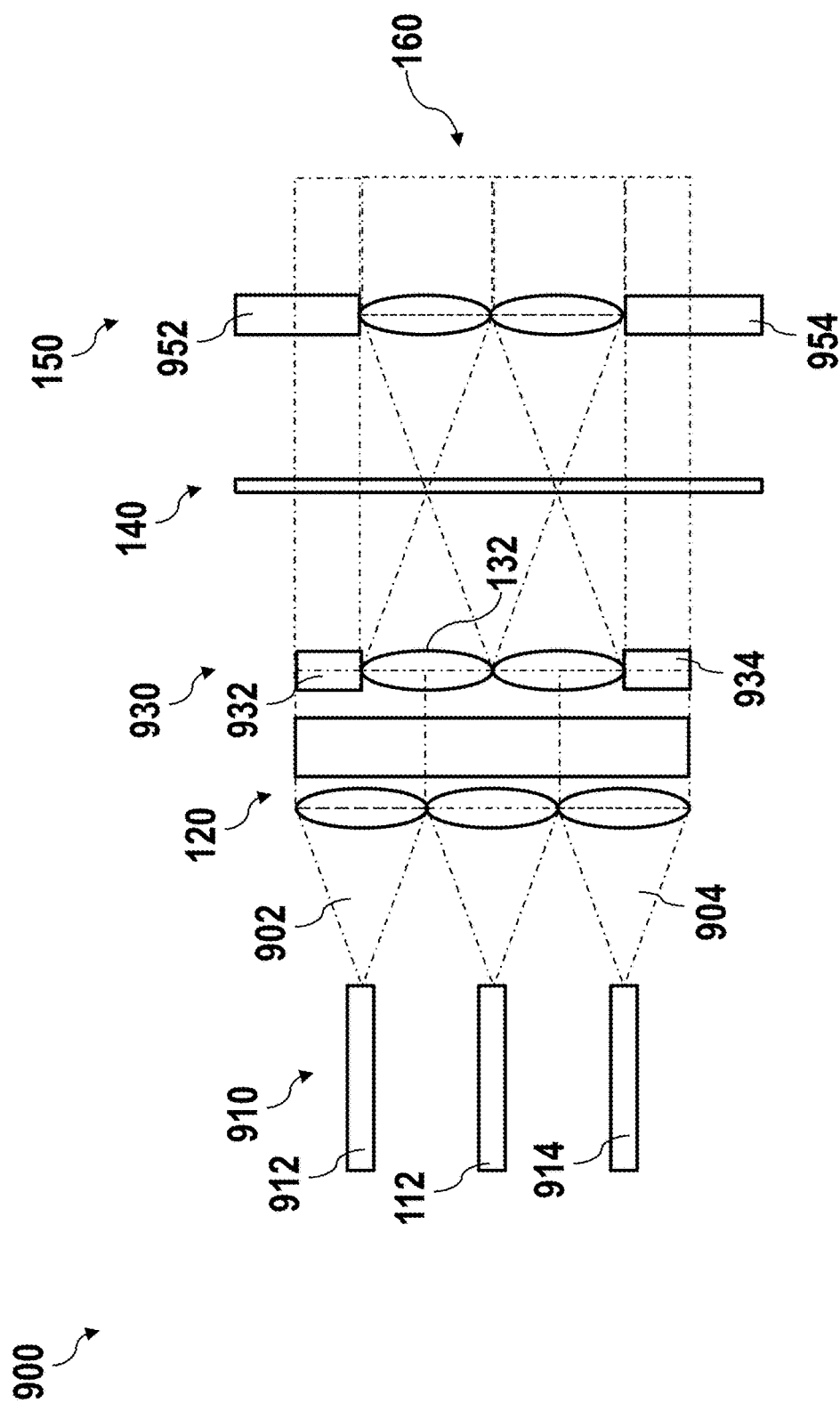
FIG. 9 is a cross-sectional illustration of the coherent beam coupled laser diode array of FIG. 1 with flat collimation optics for the exterior laser diodes, in accordance with the first exemplary embodiment of the present disclosure.

FIG. 9 is a cross-sectional illustration of the coherent beam coupled laser diode array 900 of FIG. 1 with flat collimation optics 932, 934 for the exterior laser diodes 912, 914, in accordance with the first exemplary embodiment of the present disclosure. The coherent beam coupled laser diode array 900 (hereinafter "array 900") includes a laser diode array 910, array 120 of collimation optics, first lenslet array 930, partially reflecting mirror 140, and second lenslet array 150. The laser diode array 910 includes exterior laser diodes 912, 914. In practice, these may be the outermost laser diodes within the laser diode array 910. FIG. 9 shows an array of 3 laser diodes for simplicity. However, this is exemplary only. The laser diode array 910 may include any number of laser diodes and any suitable bar pitch, as discussed relative to FIG. 1. FIG. 9 is merely intended to illustrate the optical components that may be used to direct the outermost beams emitted by the array 100 shown in FIGS. 1-8, above.

The exterior laser diodes 912, 914 may emit beams 902, 904 that propagate through the array 120 of collimation optics and the first lenslet array 932. While the lenslets 132 shown for the interior laser diodes 112 are illustrated as common refractive lenses having a radius of curvature and a full pitch matching the width of the beams 902, 904, the exterior lenslets 932, 934 may be planar and may have a pitch of substantially one-half the width of the beams 902, 904. The planar exterior lenslets 932, 934 may essentially allow the beams 902, 904 to propagate through without any substantial angular deviation. In one example, exterior portions of the lenslet array 930 may be planar. When the beams 902, 904 from the exterior laser diodes 912, 914 propagate through the first lenslet array 930, a first portion of those beams 902, 904 may be directed through a curved lenslet 132 to be partially fed back into the array 100 and directed to an interior laser diode 102. A second portion of the beams 902, 904 may not be subject to angular deviation in the beam so that it may be partially transmitted and partially reflected by the partially reflecting mirror 140 in parallel with its collimated path. This may prevent unwanted loss of light from the exterior laser diodes.

Similarly, the transmitted portions of the beams 902, 904 may propagate through the second lenslet array 150. At the exterior points on the second lenslet array 150, the exterior lenslets 952, 954 may be planar and may have a pitch of substantially one-half the width of the beams 902, 904. FIG. 9 shows the exterior lenslets 952, 954 having a larger pitch; however, the pitch may be at least one-half the width of the beams 902, 904.

Using the planar lenslets 932, 934, 952, 954, the single beam 160 may fill the exit pupil of the array 100 while remaining collimated.

Figure 10:
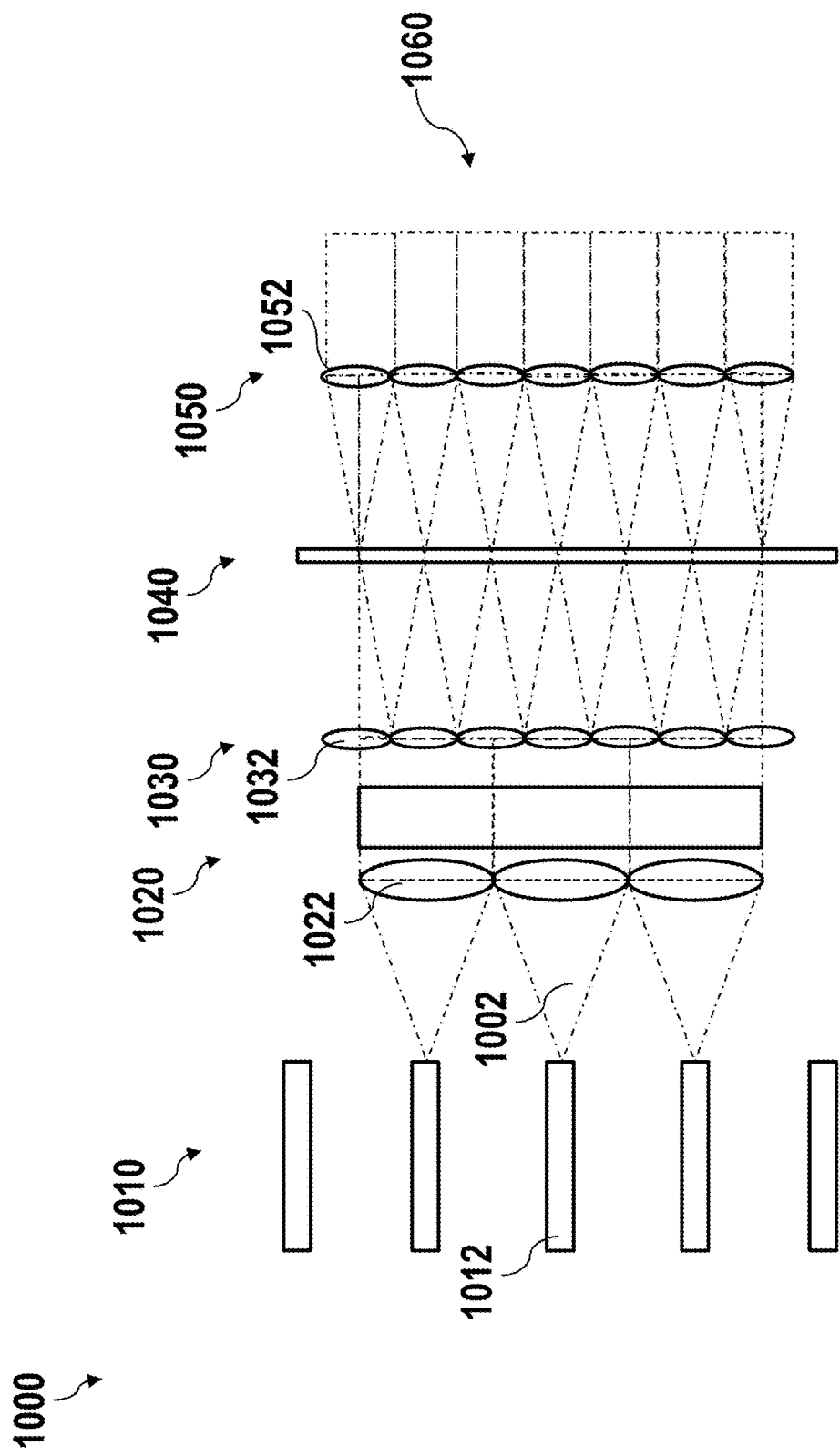
FIG. 10 is a cross-sectional illustration of a coherent beam coupled laser diode array with small lenslets, in accordance with the first exemplary embodiment of the present disclosure.

FIG. 10 is a cross-sectional illustration of a coherent beam coupled laser diode array 1000 with small lenslets 1032, in accordance with the first exemplary embodiment of the present disclosure. The coherent beam coupled laser diode array 1000 (hereinafter "array" 1000) may include similar optical components to the array 100 in FIG. 1, including an array of laser diodes 1010, array 1020 of collimation optics, a first lenslet array 1030, a partially reflecting mirror 1040, and a second lenslet array 1050. A laser diode 1012 in the laser diode array 1010 may emit a beam 1002 expanding to a width at the array 1020 of collimation optics. A set of collimation optics 1022 may collimate the beam 1002, which may propagate to the first lenslet array 1030. The lenslets 1032 in the first lenslet array 1030 may be smaller than the lenslets shown relative to FIG. 1. In one example, the lenslets 1032 may be smaller than the collimation optics 1022, for instance, having a pitch of about one-half the pitch of the collimation optics 1022. In one example, the pitch may be smaller than one-half the pitch of the collimation optics 1022. The pitch may be measured as the height of the collimation optics 1022 and lenslets 1032 shown vertically in FIG. 10.

In this example, the lenslets 1032 may be oriented such that the beam 1002 propagates through three or more lenslets 1032. This may spatially separate the beam 1002 into three or more refracted beams propagating toward the partially reflecting mirror 1040. The refracted beams may be partially transmitted and partially refracted as described relative to FIGS. 1-9, above. The second lenslet array 1050 may also include lenslets 1052 of similar size and orientation as the first lenslet array 1030.

The optical cross coupling created by the array 1000 may include more refracted beams than the optical cross coupling created by the array 100 shown in FIG. 1. This may contribute to increased coherence of the resultant single beam 1060.

Figure 11:
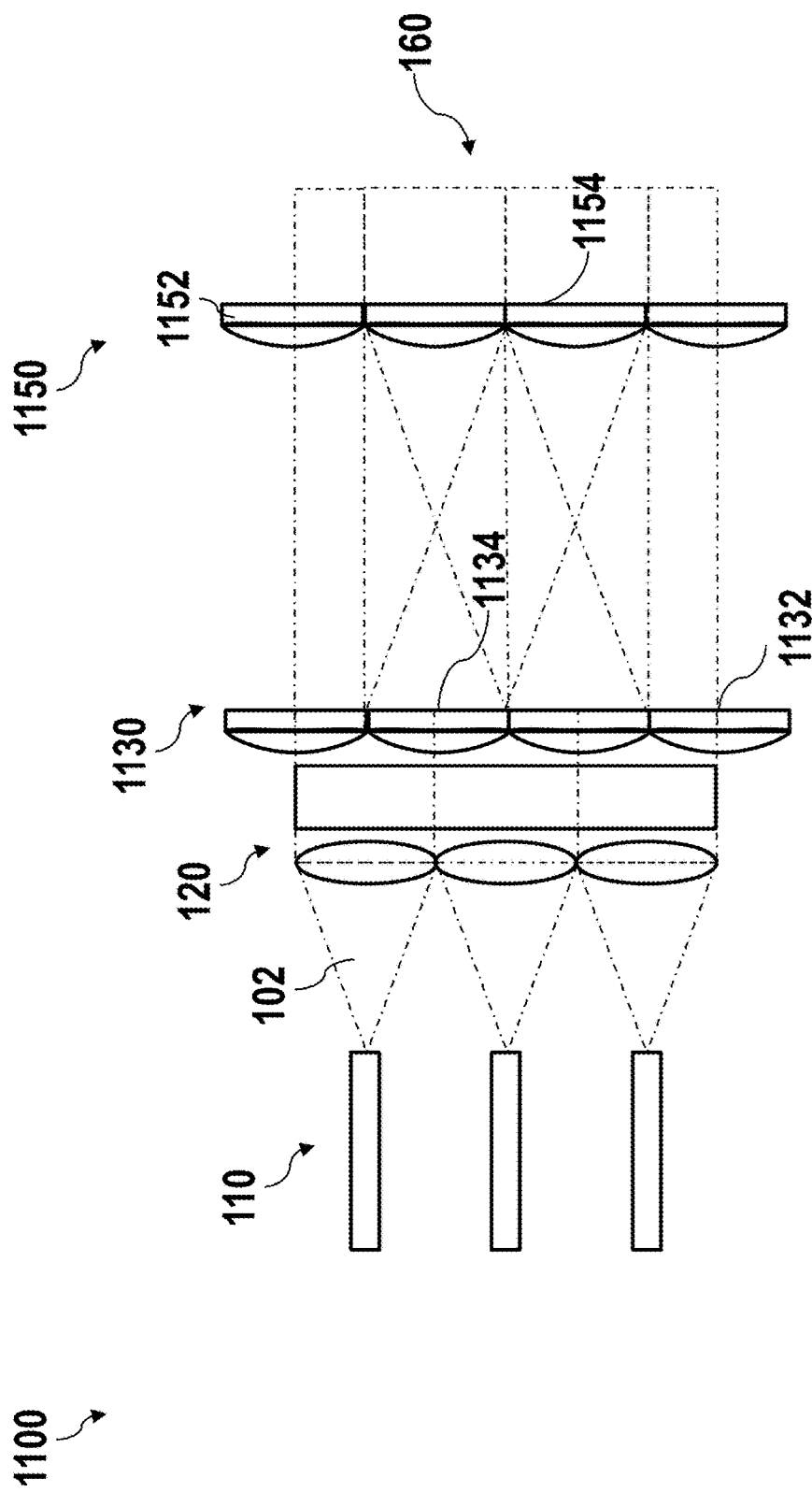
FIG. 11 is a cross-sectional illustration of a coherent beam coupled laser diode array, in accordance with the first exemplary embodiment of the present disclosure.

FIG. 11 is a cross-sectional illustration of a coherent beam coupled laser diode array 1100 (hereinafter "array 1100"), in accordance with the first exemplary embodiment of the present disclosure. The array 1100 may include similar components as the array 100 shown in FIG. 1, including an array of laser diodes 110, collimation optics 120, and first and second lenslet arrays 1130, 1150. The first and second lenslet arrays 1130, 1150 may include lenslets 1132, 1152 having a planar surface. In one example, the planar surface may be the rear surface of the lenslets 1132, 1152. The lenslets 1132, 1152 may be convex-plano singlets or doublets. The planar surface of the lenslets 1132, 1152 may include a reflective coating 1134, 1154. The reflective coating 1134, 1154 may be a partially reflective coating that may allow a portion of each beam 102 to be transmitted through the lenslets 1132, 1152 and a portion of each beam 102 to be reflected off of the coating 1134, 1154. These coatings 1134, 1154 may act as the partially reflecting mirror shown in FIGS. 1-10. In one example, the reflectivity and transmissivity of the reflective coatings 1134, 1154 may be different—i.e., the coating 1134 on the first lenslet array 1130 may allow a different amount of light to be transmitted than the coating 1154 on the second lenslet array. The coatings 1134, 1154 may be applied to the lenslets 1132, 1152 in any suitable manner. In the example where the lenslets 1132, 1152 are made from doublets, the reflective coatings 1134, 1154 may be located on a front surface or a rear surface of the second element in the doublet. FIG. 11 shows, as an example, the reflective coatings 1134, 1154 located on the rear surface of the second element; however, the reflective coatings 1134, 1154 may alternatively be located on the front surface.

Figure 12:
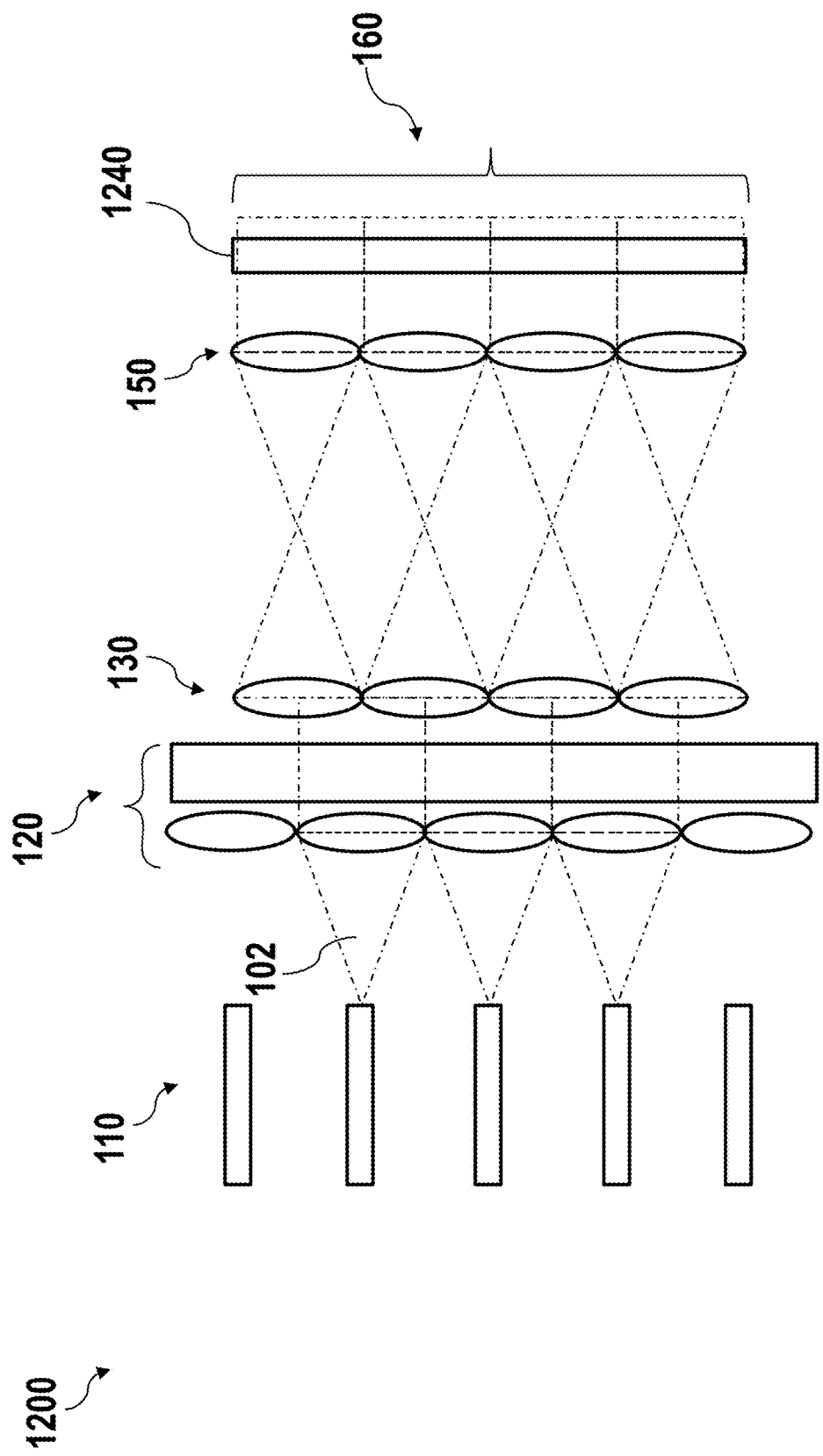
FIG. 12 is a cross-sectional illustration of a coherent beam coupled laser diode array with a partially reflecting mirror or a wavelength selective element, in accordance with the first exemplary embodiment of the present disclosure.

FIG. 12 is a cross-sectional illustration of a coherent beam coupled laser diode array 1200 (hereinafter "array" 1200) with partially reflecting mirror or a wavelength selective element 1240, in accordance with the first exemplary embodiment of the present disclosure. The array 1200 may include similar components as FIG. 1, above, including a laser diode array 110, collimation optics 120, and first and second lenslet arrays 130, 150. The array 1200 may also include an optical element 1240 positioned behind the second lenslet array 150 such that the beams 102 propagate through the optical element 1240 after they have been re-collimated by the second lenslet array 150. In one example, the optical element 1240 may be a partially reflecting mirror 1240, which may allow a first portion of the beams 102 to propagate through the partially reflecting mirror 1240 and a second portion of the beams 102 to reflect back toward the second lenslet array 150. The partially reflecting mirror 1240 may provide a spectrally broad optical cross coupling for each diode in the laser diode array 110 in this configuration.

In another example, the optical element 1240 may be a wavelength selective element, such as a diffraction grating, Bragg grating, or other elements that may allow particular wavelengths of light to be transmitted. In use, the wavelength selective element 1240 may only allow a narrow band of light to propagate through the wavelength selective element 1240. Any portion of the beams 102 having wavelengths outside of this band may be reflected back into the array 1200. The use of a wavelength selective element 1240 may provide a spectrally selective optical cross coupling for the diodes in the laser diode array 110.

Figure 13:
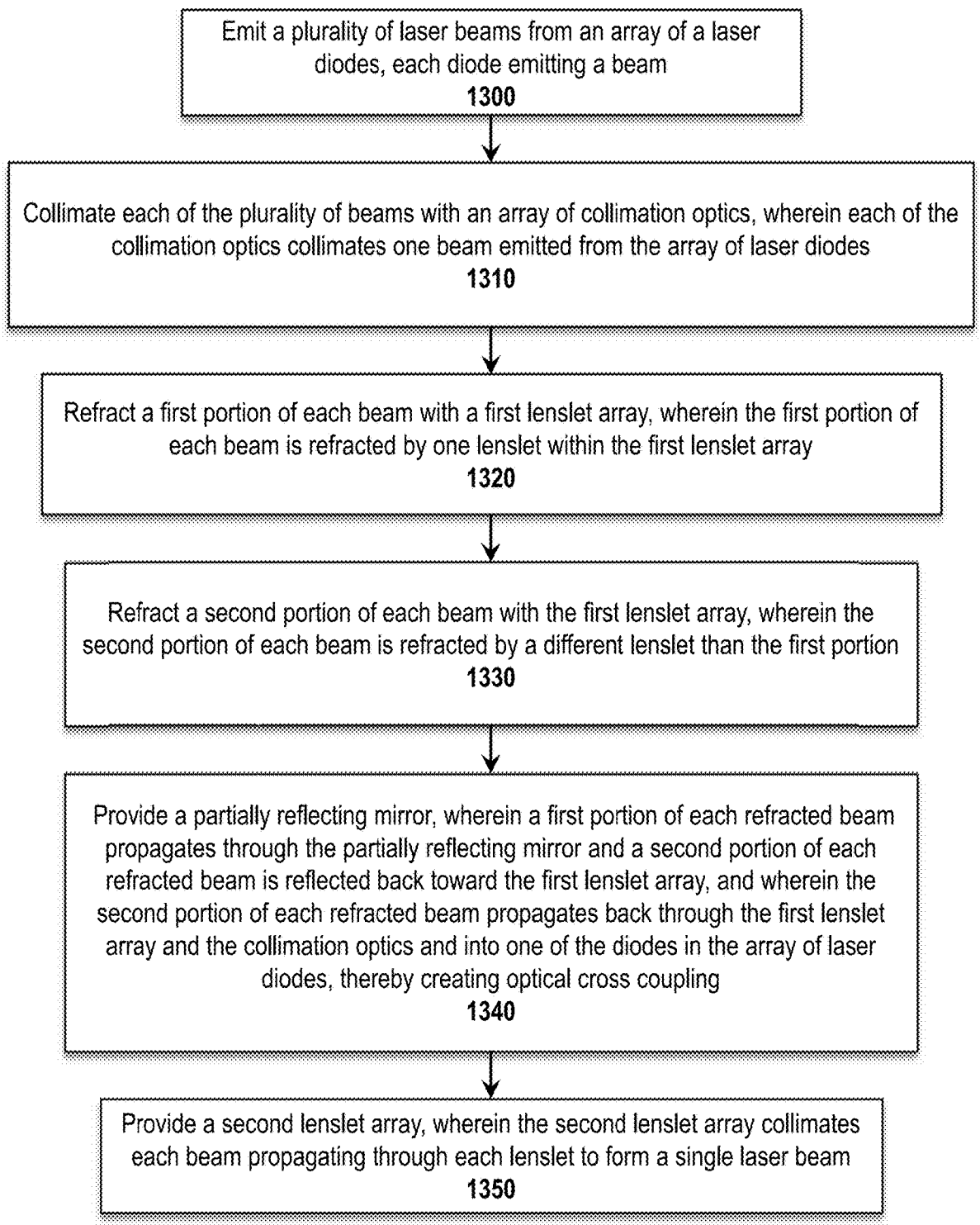
FIG. 13 is a flowchart illustrating a method of optically cross coupling a laser diode array, in accordance with a second exemplary embodiment of the present disclosure.

FIG. 13 is a flowchart illustrating a method of optically cross coupling a laser diode array, in accordance with a second exemplary embodiment of the present disclosure. It should be noted that any process descriptions or blocks in flow charts should be understood as representing modules, segments, portions of code, or steps that include one or more instructions for implementing specific logical functions in the process, and alternate implementations are included within the scope of the present disclosure in which functions may be executed out of order from that shown or discussed, including substantially concurrently or in reverse order, depending on the functionality involved, as would be understood by those reasonably skilled in the art of the present disclosure.

Step 1300 includes emitting a plurality of laser beams from an array of laser diodes, each diode emitting a beam.

Step 1310 includes collimating each of the plurality of beams with an array of collimation optics, wherein each of the collimation optics collimates one beam emitted from the array of laser diodes.

Step 1320 includes refracting a first portion of each beam with a first lenslet array, wherein the first portion of each beam is refracted by one lenslet within the first lenslet array.

Step 1330 includes refracting a second portion of each beam with the first lenslet array, wherein the second portion of each beam is refracted by a different lenslet than the first portion.

Step 1340 includes providing a partially reflecting mirror, wherein a first portion of each refracted beam propagates through the partially reflecting mirror and a second portion of each refracted beam is reflected back toward the first lenslet array, and wherein the second portion of each refracted beam propagates back through the first lenslet array and the collimation optics and into one of the diodes in the array of laser diodes, thereby creating an optical cross coupling.

Step 1350 includes providing a second lenslet array, wherein the second lenslet array collimates each beam propagating through each lenslet to form a single laser beam.

The method may further include any other features, components, or functions disclosed relative to any other figure of this disclosure.

It should be emphasized that the above-described embodiments of the present disclosure, particularly, any "preferred" embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A coherent beam coupled laser diode array, comprising:
an array of laser diodes, each diode emitting a beam propagating along a beam path;
an array of collimation optics, wherein each of the collimation optics collimates one beam emitted from the array of laser diodes;
a first lenslet array, wherein a first portion of each lenslet refracts a portion of one of the collimated beams, wherein a second portion of each lenslet refracts a portion of another of the collimated beams, and wherein the resulting collimated beams are spatially separated from each other by the first lenslet array;
a partially reflecting mirror, wherein a first portion of each beam refracted by the first lenslet array propagates through the partially reflecting mirror and a second portion of each beam refracted by the first lenslet array is reflected back toward the first lenslet array, and wherein the second portion of each beam reflected propagates back through the first lenslet array and the collimation optics and into one of the diodes in the array of laser diodes adjacent to the diode from which the second portion of each beam was emitted, thereby creating an optical cross coupling; and
a second lenslet array, wherein the second lenslet array collimates the first portion of each beam refracted by the first lenslet array propagating through each lenslet to form a single laser beam, and wherein the lenslets in the first and second lenslet arrays have a pitch smaller than a pitch of the collimation optics.

2. The array of claim 1, wherein a time averaged output of the beam emitted from the adjacent diode includes characteristics of the second portion of each beam reflected into the adjacent diode.

3. The array of claim 2, wherein the beam emitted from the adjacent diode propagates through the collimation optics, first lenslet array, partially reflecting mirror, and second lenslet array to form the single laser beam.

4. The array of claim 1, wherein the pitch of the lenslets in the first and second lenslet arrays is one-half the pitch of the collimation optics.

5. The array of claim 1, wherein lenslets at exterior portions of the first and second lenslet arrays are planar and have a pitch of about one-half a width of each beam at the collimation optics.

6. The array of claim 1, wherein at least one surface of the first lenslet array is a planar surface.

7. The array of claim 6, wherein the planar surface is the partially reflecting mirror.

8. The array of claim 1, wherein at least one surface of the second lenslet array is a planar surface.

9. The array of claim 8, wherein the planar surface is the partially reflecting mirror.

10. The array of claim 1, wherein the partially reflecting mirror is positioned behind the second lenslet array.

11. A method of optically cross coupling a laser diode array, comprising the steps of:
emitting a plurality of laser beams from an array of laser diodes, each diode emitting a beam;
collimating each of the plurality of beams with an array of collimation optics, wherein each of the collimation optics collimates one of the beams emitted from the array of laser diodes;
refracting a first portion of each of the collimated beams with a first lenslet array, wherein the first portion of each of the collimated beams is refracted by one lenslet within the first lenslet array;
refracting a second portion of each of the collimated beams with the first lenslet array, wherein the second portion of each of the collimated beams is refracted by a different lenslet than the first portion, and wherein the resulting collimated beams are spatially separated from each other by the first lenslet array;
providing a partially reflecting mirror, wherein a first portion of each refracted beam propagates through the partially reflecting mirror and a second portion of each refracted beam is reflected back toward the first lenslet array, and wherein the second portion of each refracted beam propagates back through the first lenslet array and the collimation optics and into one of the diodes in the array of laser diodes adjacent to the diode from which the second portion of each beam was emitted, thereby creating an optical cross coupling; and
providing a second lenslet array, wherein the second lenslet array collimates the first portion of each refracted by the first lenslet array propagating through each lenslet to form a single laser beam, and wherein the lenslets in the first and second lenslet arrays have a pitch smaller than a pitch of the collimation optics.

12. The method of claim 11, wherein a time averaged output of the beam emitted from the adjacent diode includes characteristics of the second portion of each beam reflected into the adjacent diode.

13. The method of claim 12, wherein the beam emitted from the adjacent diode propagates through the collimation optics, first lenslet array, partially reflecting mirror, and second lenslet array to form the single laser beam.

14. The method of claim 11, wherein lenslets at exterior portions of the first and second lenslet arrays are planar and have a pitch of about one-half a width of each beam at the collimation optics.

15. A coherent beam coupled laser diode array, comprising:
an array of laser diodes, each diode emitting a beam propagating along a beam path;
an array of collimation optics, wherein each of the collimation Optics collimates one beam emitted from the array of laser diodes;
a first lenslet array, wherein a first portion of each one of the collimated beams is refracted by one lenslet within the first lenslet array, wherein a second portion of each one of the collimated beams is refracted by a different lenslet within the first lenslet array, and wherein the resulting collimated beams are spatially separated from each other by the first lenslet array;
a partially reflecting mirror, wherein a first portion of each beam refracted by the first lenslet array propagates through the partially reflecting mirror and a second portion of each beam refracted by the first lenslet array is reflected back toward the first lenslet array, and wherein the second portion of each beam reflected propagates back through the first lenslet array and the collimation optics and into one of the diodes in the array of diodes adjacent to the diode from which the second portion of each beam was emitted, thereby creating an optical cross coupling; and
a second lenslet array, wherein the second lenslet array collimates the first portion of each beam refracted by the first lenslet array propagating through each lenslet to form a single laser beam, and wherein the lenslets in the first and second lenslet arrays have a pitch smaller than a pitch of the collimation optics.

16. The array of claim 15, wherein a time averaged output of the beam emitted from the adjacent diode includes characteristics of the second portion of each beam reflected into the adjacent diode.

17. The array of claim 16, wherein the beam emitted from the adjacent diode propagates through the collimation optics, first lenslet array, partially reflecting mirror, and second lenslet array to form the single laser beam.

18. The array of claim 15, wherein the pitch of the lenslets in the first and second lenslet arrays is one-half the pitch of the collimation optics.

19. The array of claim 15, wherein lenslets at exterior portions of the first and second lenslet arrays are planar and have a pitch of about one-half a width of each beam at the collimation optics.

20. A coherent beam coupled laser diode array, comprising:

an array of laser diodes, each diode emitting a beam propagating along a beam path;

an array of collimation optics, wherein each of the collimation optics collimates one beam emitted from the array of laser diodes;

a first lenslet array, wherein a first portion of each lenslet refracts a portion of one of the collimated beams, wherein a second portion of each lenslet refracts a portion of another of the collimated beams, and wherein the resulting collimated beams are spatially separated from each other by the first lenslet array;

a second lenslet array, wherein the second lenslet array collimates the beams refracted by the first lenslet array, and wherein the lenslets in the first and second lenslet arrays have a pitch smaller than a pitch of the collimation optics; and a wavelength selective element, wherein a portion of each beam collimated by the second lenslet array having a selected wavelength propagates through the wavelength selective element to form a single beam, thereby creating an optical cross coupling.

\* \* \* \* \*